US007876247B1

(12) United States Patent
Hunt et al.

(10) Patent No.: US 7,876,247 B1
(45) Date of Patent: Jan. 25, 2011

(54) SIGNAL DEPENDENT DITHER

(76) Inventors: Shawn David Hunt, P.O. Box 5025, Mayaguez, PR (US) 00681; Carlos Fabian Benitez-Quiroz, P.O. Box 5025, Mayaguez, PR (US) 00681

(\*) Notice: Subject to any disclaimer, the term of this patent is extended or adjusted under 35 U.S.C. 154(b) by 190 days.

(21) Appl. No.: 12/325,223

(22) Filed: Nov. 30, 2008

Related U.S. Application Data

(60) Provisional application No. 61/004,706, filed on Nov. 29, 2007.

(51) Int. Cl.
*H03M 1/20* (2006.01)

(52) U.S. Cl. ...................................... 341/131; 382/239

(58) Field of Classification Search ................. 341/131; 382/239, 252, 248, 251, 54, 56; 375/39, 375/77, 67, 86, 76, 99
See application file for complete search history.

(56) References Cited

U.S. PATENT DOCUMENTS 5,337,251 A * 8/1994 Pastor .......................... 702/70

\* cited by examiner

*Primary Examiner*—Joseph Lauture
(74) *Attorney, Agent, or Firm*—Hoglund & Pamias, P.S.C.; Roberto J. Rios

(57) ABSTRACT

A new technique on the dithering of one-dimensional signals is presented. The novel technique determines whether dither is needed when reducing the bit depth and evaluates whether the total error of the un-dithered quantization is white noise. If this is the case, then no undesired harmonics are added in the quantization or re-quantization process. The novel technique presents a state of the art signal-dependent dither having a lower quantization noise.

19 Claims, 26 Drawing Sheets

(a) Total error signal without dither (b) Total error signal with adaptive dither (c) Difference between Quantized Signal with and without Adaptive Dither

FIG. 1
-Prior Art-
(a) Straight PCM 3 bits image
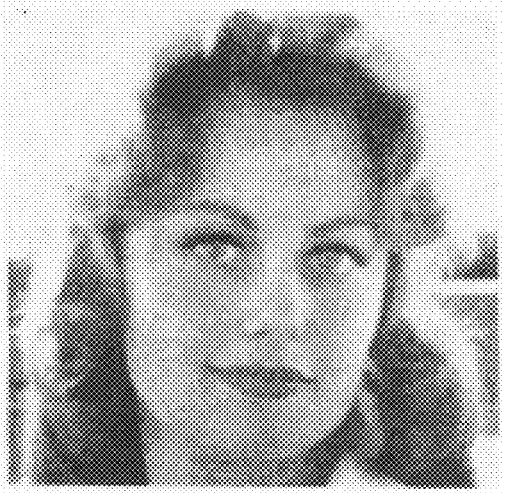
(b) Dithered 3 bits image
(c) Straight PCM 2 bits image
(d) Dithered 2 bits image

-Prior Art- (a) Flooring transfer function  (b) Rounding transfer Function

FIG. 6
-Prior Art-
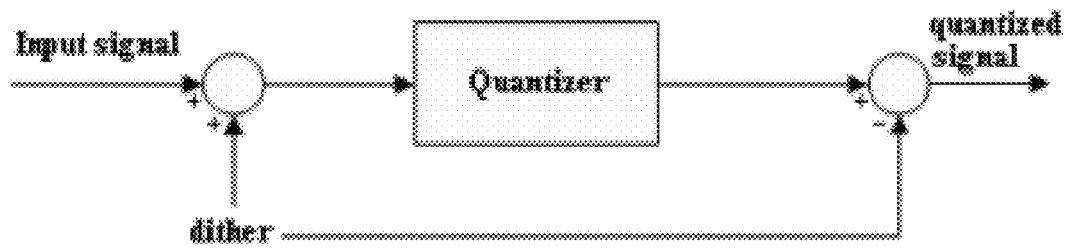
(a) Subtractive dithering
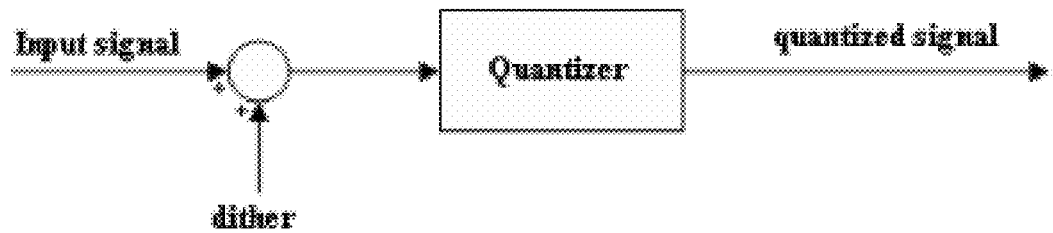
(b) Non subtractive dithering

SIGNAL DEPENDENT DITHER

GOVERNMENT INTEREST

The claimed invention was made with U.S. Government support under grant number EEC-9986821 awarded by the National Science Foundation (NSF). The government has certain rights in this invention.

FIELD OF THE INVENTION

The present invention is related to digital signals enhancement and more particularly, to the addition of dithering to digital signals.

BACKGROUND OF THE INVENTION

Digital signals have become widespread and are favored in many applications because of their noise immunity. This is a result of their discreteness in both time and amplitude. Once the signal has been discretized, the signal can be stored or transmitted without additional noise being added. There are many applications however, where the discretization in both time and amplitude needs to be changed in the discrete domain. For example, if two digital systems operate at different sampling frequencies, a multirate system is used for the sampling rate conversion. The amplitude discretization can also be changed. Going from a 16 to an 8 bit representation, for example, would reduce the memory requirements for storing a signal. For instance, in gaming applications the precision of each sample is about 12 bits and the ring tones have a resolution of 8 bits. The process of lowering the amplitude resolution of a digital signal is called re-quantization.

If the signal amplitude change is large from sample to sample, then it is generally assumed that the re-quantization will be a uniformly (discrete) distributed i.i.d. (independent and identically distributed) sequence (white noise). In this case, the re-quantization error is independent of the signal being quantized. This assumption does not hold for all cases particularly when the signal has small amplitude. In this case rounding or truncating a signal can introduce various undesirable artifacts, namely, additional harmonics related to the signal being re-quantized. For this case, the re-quantization error is an autoregressive moving average (ARMA) process that cannot be modeled like a white noise sequence.

To avoid these unwanted harmonics, dither is generally added to the signal being quantized. Dither is an i.i.d. signal whose purpose is to ensure that the quantization error is uncorrelated with the signal being quantized. In addition, the dither signal is independent of the input. In additive dithering, the quantization error signal is dependent of the signal being quantized but some techniques can make the value of the first and second statistical moments independent of the error. The main disadvantage of adding dither is that since the dither is basically a noise signal, the signal to noise ratio (SNR) of the final re-quantized signal is lowered. Because of this, it is desirable to know if re-quantization will introduce the undesired harmonics. In some cases, the quantization noise will be an i.i.d signal even though no dither is added. In these cases, the signal can be re-quantized with no added harmonics, and without the signal to noise ratio penalty.

Another problem in the classic dithering model is that the amount of error is difficult to control when the probability density function (PDF) of the dither is uniform (RPDF) or gaussian (GPDF). It has been proved that dither with a triangular PDF (TPDF) can produce an error signal which has a constant variance, as this renders the first and second moments independent of the input. This dither has a larger variance in contrast to RPDF dither and the advantage of this dither is supported with psycho-acoustic tests which show that users prefer a constant noise instead of a non-constant noise. It has also been proved that, it is not possible to make a classic dither with a constant and lower variance in the quantization error than the one obtained with TPDF dither.

History of Quantization and Dithering

A lot of research has been done in the area of quantization and dithering. Different schemes of analog to digital conversion such as uniform and non-uniform quantization have been developed to sample continuous signals. For the purpose of this explanation, the quantization and re-quantization are assumed to be uniform where the difference between quantization levels is constant.

The study of quantization properties and its effects increased after the middle of the 20th century. An important mathematical foundation was published and recently summarized by Widrow (incorporated herein by reference). He establishes that quantization error can be modeled as a uniform i.i.d sequence under a given set of conditions. He found that the process of obtaining the probability density function (PDF) of the quantized signal is similar to Shannon's Sampling Theorem and named "Area Sampling". It is explained how, having the relationship between the input and the output, and the PDF of the output of the quantizer, the original distribution could be recovered. Moreover, Widrow's research work defined the higher order statistics of quantization error and the study of the quantization output moments.

Dithering

The word dithering was originally used during in the Second World War. Aircraft bomb trajectory was more accurate when the airplane was flying, since the vibration reduces the error of moving parts. This vibration was termed dithering. Some initial applications of dithering were introduced by Roberts in his PhD thesis at MIT in (incorporated herein by reference). His work was related to the transmission of images in a digital television channel. To transmit a picture, the length of each sample was of at least 6 bits in the Pulse Code Modulation (PCM) standard. This is because the human eye is sensitive to the small changes in intensity. With the use of dithering, Roberts could reduce the resolution to 3 bits. In this work, he added small amounts of noise to the signal before quantization to cause the same effect in the perception of the eye with fewer bits. Some examples extracted from his thesis are shown in FIG. 1.

Later in 1964, Schuchman determined sufficient and necessary conditions of dither to have a minimum loss of statistical properties. For instance, one condition is that statistical dither must be independent of the signal to be quantized.

The state of the art dithering techniques used in industry about dithering were developed at least 20 years ago. Gray and Stokham summarized the most important research about dithered quantizers in (incorporated herein by reference). In this work, the theory of the subtractive and non-subtractive dithering and its statistical properties was explained. Also, Gray analyzed the spectra of quantization noise and summarized principal concepts about quantization, vector quantization, and dithering]. In addition, a strong mathematical foundation for the theory of non-subtractive dithering was developed in the AudioLab at University of Waterloo. These include the first and second order statistics of the system input and output and the introduction of digital dither.

In the middle of the 1980's, digital processing became more widespread and it was necessary to include dither in digital systems. In digital systems, the process of lowering the resolution of a signal is called re-quantization. Another study of digital quantization comes to the same conclusion as with continuous quantization. This work also introduces digital dither. Their work was extended when triangular PDF dither was used in digital audio. Currently, TPDF is the most popular technique of dithering in one-dimensional signals.

Dither is used in various applications. One of the most famous applications was developed in Bell Labs where Jayant and Rabiner used RPDF in speech processing (incorporated herein by reference). Another application uses GPDF in a high speed digital system for the suppression of the electromagnetic field. Furthermore, dithering is used in feedback systems to reduce the oscillation at high frequency.

Noise Shaping

One of the main objectives of this invention is to have white re-quantization error when quantizing signals. On the other hand, in some applications it is better to have a non-white noise. For example, human beings have greater perception of sound near to 4 kHz. It is possible to modulate (i.e, change the frequency) of the error signal to frequencies where we are less sensitive. In other words, this process changes the shape of the error spectrum to be minimally audible as it is shown in FIG. 3. This process is known as "noise shaping". FIG. 2 illustrates a general scheme for noise shaping, where Q is the quantizer (re-quantizer) and H(z) is a feedback filter. The difference between the input to the quantizer and the output is filtered and added to the input to modulate the total error.

Knowing the advantages and disadvantages of the prior art, what is needed is the development and software/hardware implementation of an algorithm that measure the need for dithering and to develop a segment dependent dither where dither is added only to the segments where need dither, thus, providing adaptive dither with lower variance than the prior art.

SUMMARY OF THE INVENTION

An object of the invention is to demonstrate that hypothesis testing can be used effectively to determine if the total error of a re-quantized signal is white noise.

According to another aspect of the invention, the application to real audio signal re-quantizing is straight forward. The signal can be segmented, and each segment tested for the whiteness of the quantization noise. Dither can be added to the segments that do not pass the tests.

In accordance to a further aspect of the invention, an application for segment dependent dithering was developed where a signal is re-quantized from a first bit precision to a second lower bit precision adding dither to the segments where the total quantization error is not white noise.

Other embodiments, features and advantages of the present invention will be apparent from the following specification taken in conjunction with the following drawings

BRIEF DESCRIPTION OF THE DRAWINGS

The above-described features of the invention will be more clearly understood from the following detailed description, which is provided with reference to the accompanying drawings in which:

FIG. 1 shows several examples of signal dithering according to the prior art.

FIG. 6 illustrates dithering schemes according to the prior art.

DETAILED DESCRIPTION OF THE INVENTION

In order to establish the framework of the present invention, the specification will describe the statistics of re-quantization noise like mean and variance and the autocorrelation and power spectral density of the quantization noise assuming a set of condition. In addition, the total error PDF using the convolution theorem and area sampling will be derived, thus, showing that the total error is input dependent for non-subtractive dithering quantization. The total error statistical moments are defined and later used to obtain the principal properties of triangular PDF dither.

Re-Quantization

Quantization schemes determine the amplitude resolution of the digital signal. For simplicity, this description assumes a uniform quantization and discrete signals represented in 2s complement binary format. In this case, the amplitude resolution of the digital signal is determined by the number of bits used to represent each sample. The model for the lowered resolution signal is:

$$Q(x[n])=x_q[n]=x[n]+\epsilon[n]$$

where $Q(x[n])$ is the quantization operation and $x_q$ is the lower resolution quantized signal, x the original signal, n indicates the $n^{th}$ sample and $\epsilon$ the quantization noise. The simplest methods of lowering the resolution are truncation, where the lower significant bits are discarded, and rounding to the nearest integer. Since the numbers are in 2s complement, the truncation operation is $$x_q[n] = 2^{N-M} \left\lfloor \frac{x[n]}{2^{N-M}} \right\rfloor,$$

where the signal is being truncated from N to M bits, and $\lfloor \rfloor$ is the floor operation which rounds to the nearest lower integer. Similarly, the rounding operation is $$x_q[n] = 2^{N-M} \left\lfloor \frac{x[n]+1}{2^{N-M}} \right\rfloor,$$

Figure 2:
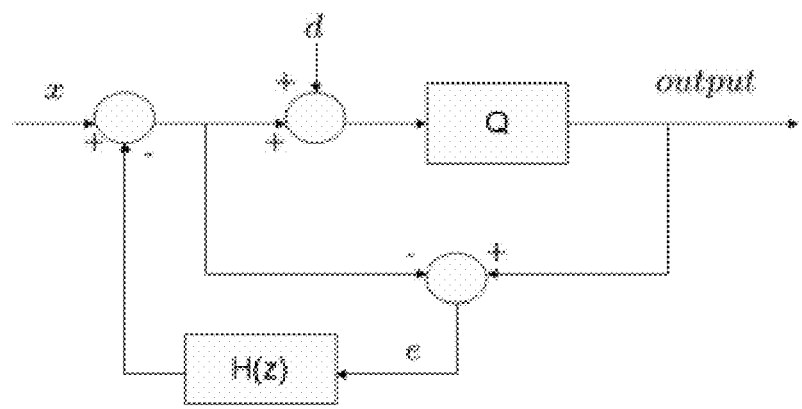
FIG. 2 illustrates a general scheme for noise shaping according to the prior art.
Figure 3:
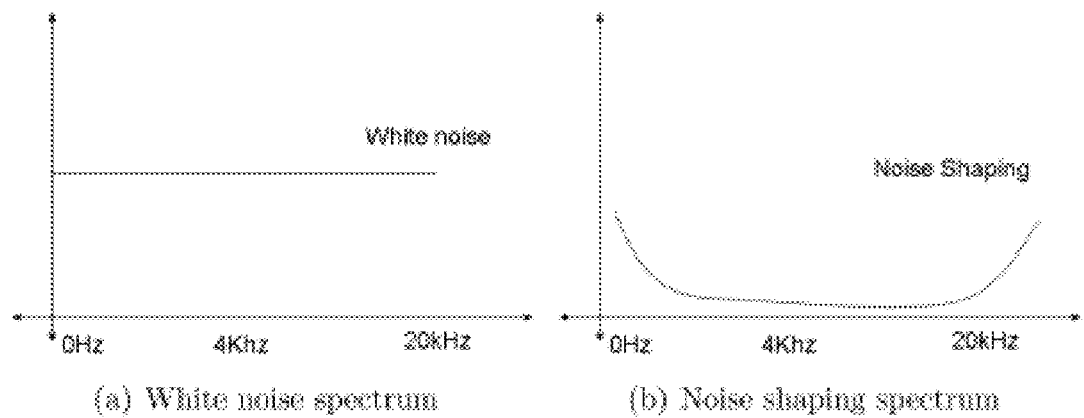
FIG. 3 shows a comparison between white noise and noise shaping.
Figure 4:
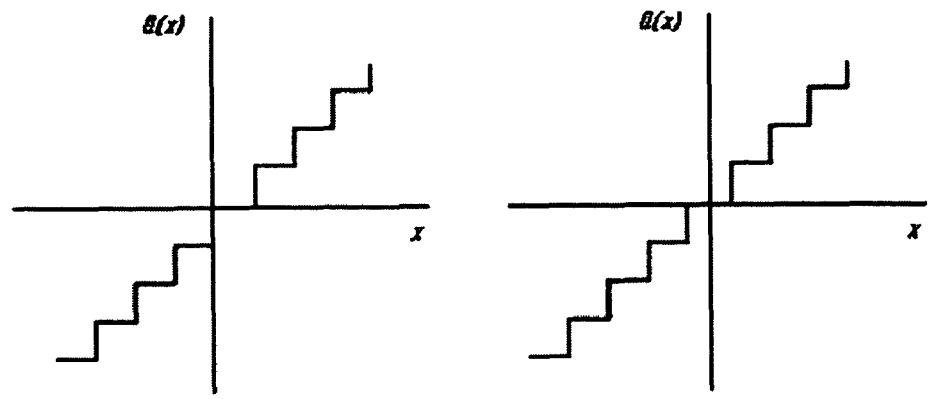
FIG. 4 shows a graphical representation of quantizers schemes.

FIG. 4 shows a graphical representation of schemes of these quantizers. Notice that in each case, the quantized signal is divided and multiplied by the factor $2^{N-M}$ so that the original and quantized signals have the same amplitude. Let the original signal have quantization levels separated by $\Delta$. The quantized signal then has quantization levels separated by $2^{N-M}\Delta$. For example, if the resolution is being lowered by one bit, the quantized signal has half the resolution and the quantization levels are now separated by $2\Delta$.

Statistics of Quantization Noise

If the signal amplitude change is large from sample to sample, then the quantization error is a uniform white noise sequence. In this case, the samples of the quantization noise are uncorrelated between them, and are distributed uniformly from either 0 to $2^{N-M}\Delta$ for truncation, or $-2^{N-M-1}\Delta$ to $2^{N-M-1}\Delta$ for rounding. Under these conditions the quantization error PDF is defined as follows:

$$Pr(\varepsilon) = \begin{cases} \frac{1}{\Delta}, & -\frac{\Delta}{2} < \varepsilon < \frac{\Delta}{2} \\ 0 & \text{otherwise} \end{cases}$$

Given the quantization noise PDF, the statistical moments of a uniform distribution are:

$$E[\varepsilon] = 0,$$

$$E[\varepsilon^2] = \frac{\Delta^2}{12},$$

and in the most general case it is given by:

$$E[\varepsilon^m] = \begin{cases} \frac{1}{m+\lambda}\left(\frac{\Delta}{2}\right)^m, & \text{for } m \text{ even} \\ 0, & \text{for } m \text{ odd} \end{cases},$$

Autocorrelation

The autocorrelation of a signal is the strength of a linear relationship between a pair of points in the signal. The autocorrelation is defined as:

$$a(\text{lag})=E[\epsilon[n]\epsilon[n+\text{lag}]],$$

where lag is the difference in time (or in samples) between a pair of random variables. When lag is different from zero, assuming an i.i.d zero mean sequence, their linear relationship between the points is zero. On the other hand, when the lag is equal to zero, then the autocorrelation is equal to the variance of the signal. In summary, the autocorrelation of white noise can be expressed mathematically as:

$$a(\text{lag}) = \begin{cases} \sigma^2, & \text{for 0 lag} \\ 0, & \text{otherwise} \end{cases}.$$

Power Spectral Density

Power Spectral Density (PSD) measures the power of a signal in the frequency domain. PSD is defined as the Fourier transform of the autocorrelation. In the case of zero mean white noise it is:

$$P(\omega) = \int_{-\infty}^{\infty} a(\tau)e^{-j\omega\tau}d\tau = \int_{-\infty}^{\infty} \sigma^2 \delta(\tau)e^{-j\omega\tau}d\tau = \sigma^2,$$

where $\delta(\tau)$ is the impulse function. This means that white noise has components in all frequencies of the spectrum with the same magnitude.

Figure 5:
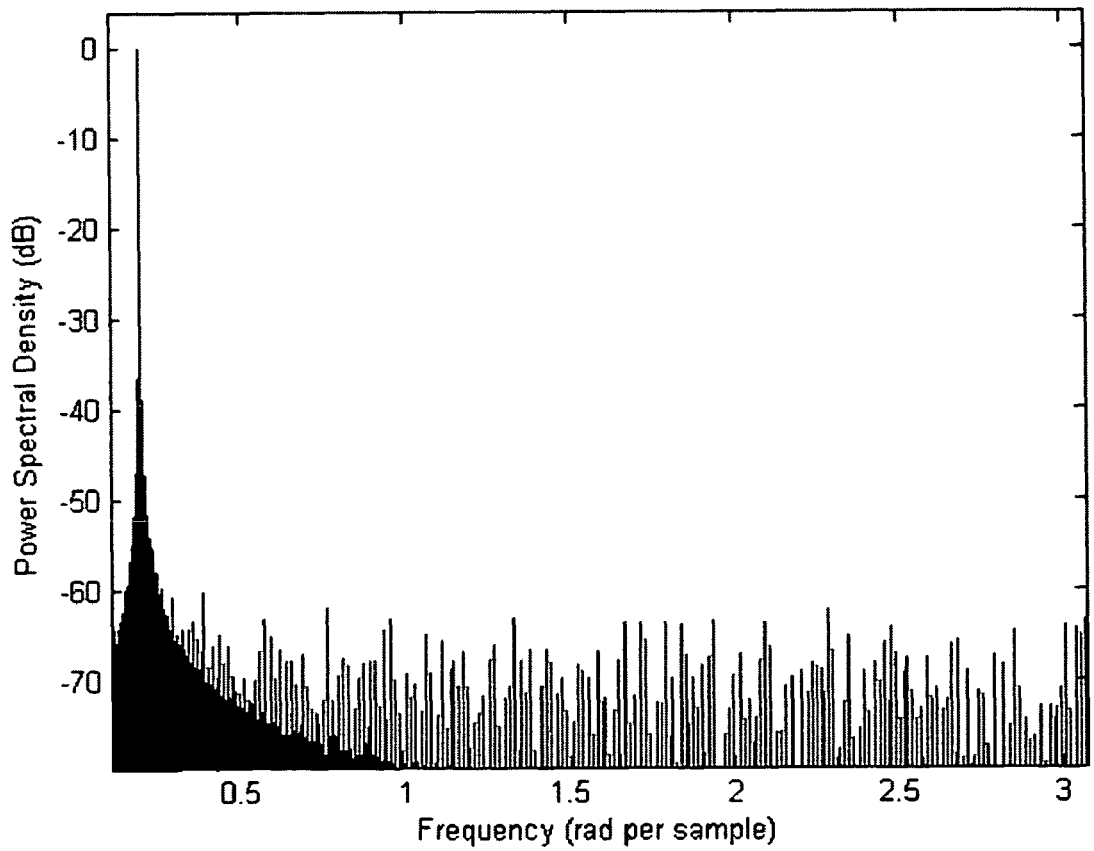
FIG. 5 shows a graph of power spectral density of a re-quantized signal.

However, the white noise assumption does not hold for all cases. The quantization process can introduce additional harmonics related to the signal being requantized. These added harmonics occur when the quantization noise $\epsilon[n]$ is highly correlated with signal x[n] and so has harmonic content related to this signal. An example of this is shown in FIG. 5, where a 1333 Hz sine wave has been requantized from 24 to 7 bits. Ideally, the power spectral density of a cosine signal is an impulse at the operation frequency. As can be viewed in FIG. 5, many impulses of small amplitude appear in the spectrum of the re-quantized signal.

Dither

To avoid these unwanted harmonics, dither is generally added to the signal before quantizing. The purpose of the dither signal is to ensure that the quantization error samples are uncorrelated with the signal being quantized. Ideally, the quantization error signal is independent of the signal being quantized, but it is generally accepted that having uncorrelated first and second moments is sufficient. Subtractive (SD) and non-subtractive dither (NSD) systems are commonly used. The difference between these schemes is that in the former, dither is subtracted after quantization. General schemes of dithered quantizers are shown in FIG. 6.

The total error ($\epsilon$) is defined as the difference between input and output signals. Thus, the SD total error as:

$$\epsilon = Q(x+d) - (x+d),$$

where x is the input signal and d is the dither signal. In contrast, the NSD total error is:

$$\epsilon = Q(x+d) - x,$$

This invention focuses on NSD, so the theoretical framework will be focused on this scheme.

Area Sampling and Dithered Quantization Error PDF

Area Sampling

Figure 7:
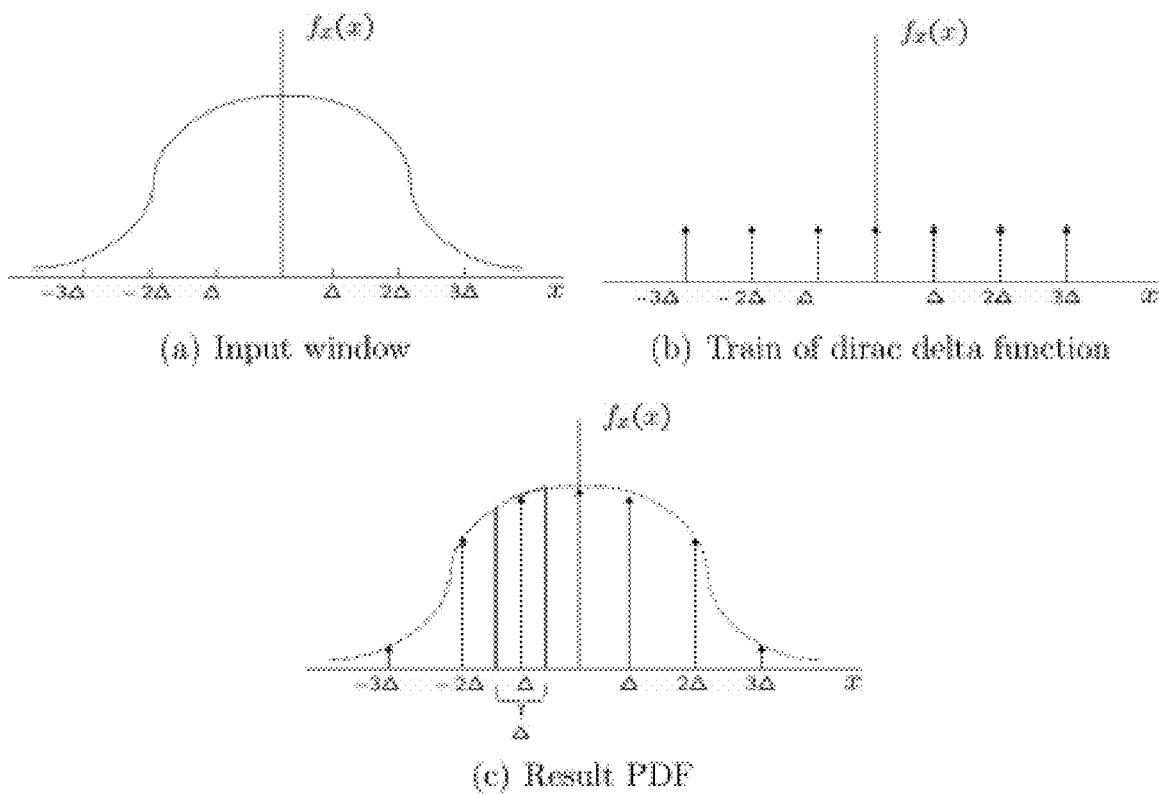
FIG. 7 shows graphs illustrating the area sampling of a signal.

Area sampling is a term used to deduce the PDF of the quantizer error. The quantizer error q[n] (different from total error) is defined as the difference between quantizer input and output. This PDF is a sampled version of the input PDF, with samples taken every $\Delta$. Specifically, the sampling process is the multiplication of the input PDF with a train of impulse functions, then scaled by in the neighborhood of the point in the input PDF. The quantizer error PDF can be represented as follows:

$$p_q(q) = \sum_{k=-\infty}^{\infty} \delta(q - k\Delta) \int_{-\frac{\Delta}{2}+k\Delta}^{\frac{\Delta}{2}+k\Delta} p(y)\,dy,$$

where q is the output signal and p(y) is the input PDF. FIG. 7 shows the process of obtaining the density of the output. The signal in (a) is multiplied with the signal in (b) to get the resulting signal shown in (c).

Total Error PDF

Knowing the quantizer error PDF, it is possible to deduce the total error PDF using the above-shown equation. Let $p_{\epsilon|p}(w,x)$ be the conditional total error PDF in a NSD system. Defining w=x+d as the input to the quantizer, the conditional PDF of the quantizer input given x is $p_{\epsilon|x}(w,x)=p_d(w-x)$. Using area sampling and the NSD total error equation defined above, the conditional total error is:

$$p_{\epsilon|x}(\varepsilon, x) = \sum_{k=-\infty}^{\infty} \delta(\varepsilon + x - k\Delta) \int_{-\frac{\Delta}{2}+k\Delta}^{\frac{\Delta}{2}+k\Delta} p_d(\omega - x)\,d\omega.$$

Therefore, multiplying by $p_x(x)$ and integrating with respect to x, the marginal PDF of $\epsilon$ is:

$$p_\varepsilon(\varepsilon) = \int_{-\infty}^{\infty} p_{\epsilon|x}(\varepsilon, x) p_x(x)\,dx,$$

In the above equation, it is clear that the total error of a NSD is always signal dependent because it is impossible to separate the error E of the input x.

Total Error Moments

The random variable PDF moments are defined as $E[x^m]$, where m represents the $m^{th}$ moment of such distribution. In many cases, this expression can be calculated using the characteristic function (CF). The CF, by definition, is the Fourier transform of a PDF. The moments are calculated evaluating the CF in the following expression:

$$E[x^m] = \int_{-\infty}^{\infty} x^\infty f_x(x)\,dx = \left(\frac{j}{2\pi}\right)^m C_x^{(m)}(0).$$

where $C_x$ is the CF of x and $C_x^{(m)}$ denotes the $m^{th}$ derivative of $C_x$.

In order to find the CF of the quantization error, the conditional total error equation previously defined is redefined as follows:

$$p_{\varepsilon|x}(\varepsilon, x) = \sum_{k=-\infty}^{\infty} \delta(\varepsilon + x - k\Delta)(\nu \times p_d)(\varepsilon).$$

where "x" denotes convolution and v(x) is a rectangular window which is defined by:

$$\varepsilon(x) = \begin{cases} 1 & -\Delta < x < \Delta \\ 0 & \text{otherwise} \end{cases}.$$

In NSD total error equation, the total error is the addition (or subtraction) of two independent random variables. Consequently, the PDF of the total error is the convolution of quantized and dithered PDFs. Substituting the above-redefined equation into the marginal PDF of E and using the convolution property, the error PDF is:

$$p_\varepsilon(\varepsilon) = [\nu \times p_d](\varepsilon) \left[ \sum_{k=-\infty}^{\infty} \delta(e + x - k\Delta) \times p_x \right](-\varepsilon).$$

Taking the Fourier transform of this equation and using the convolution theorem, the CF of $\epsilon$ is given by:

$$C_\varepsilon(f) = sinc(f) C_d(f)] \times \left[ \sum_{k=-\infty}^{\infty} \delta\left(-f - \frac{k}{\Delta}\right) C_x(-f) \right],$$

$$C_\varepsilon(f) = \sum_{k=-\infty}^{\infty} sinc\left(f - \frac{k}{\Delta}\right) C_d\left(f - \frac{k}{\Delta}\right) C_x\left(-\frac{k}{\Delta}\right).$$

The $m^{th}$ moment of the error PDF is:

$$E[\varepsilon^m] = \left(\frac{j}{2\pi}\right) \sum_{k=-\infty}^{\infty} \left( sinc\left(\frac{k}{\Delta}\right) C_d\left(\frac{k}{\Delta}\right) \right)^{(m)} C_x\left(\frac{k}{\Delta}\right).$$

Based on this formula, Lipshitz (incorporated herein by reference) demonstrates that if $$\left( sinc\left(\frac{k}{\Delta}\right) C_d\left(\frac{k}{\Delta}\right) \right)^{(m)} = 0 \ \forall\, k \neq 0.$$

then the $m^{th}$ moment is independent of the signal input. Lipshitz also shows that adding uniformly distributed white noise with an amplitude of $\Delta$ to a signal uncorrelates the mean of the total error with the input signal. Thus, if one uniform noise signal is added, the first moment of the total error is uncorrelated with the input signal. If two are added, then the first two moments are uncorrelated with the input, and similarly for the higher order moments. As mentioned above, it is generally accepted that the first and second moments are the most important, so typically two independent uniform noise signals are added. This gives the TPDF dither used in many audio applications.

This invention is concerned with the implementation of new methods of dithering. The present invention first determines statistical tests for determining the need for dithering. These hypothesis tests are used to measure if the total error is white noise. Then, it develops a new adaptive dithering technique that is input dependent and has constant variance. This adaptive dithering is obtained using optimization methods instead of the classical dithering methods that are statistical based.

Determining the Need for Dither when Re-Quantizing a 1-D Signal

Tests in the Time Domain

If the total error $\epsilon$ is white noise, then there will be no added harmonics. The most straightforward method of determining this would simply be testing the serial independence of the signal. It turns out that this is unnecessary, and only the total error needs to be tested. This is because a sufficient condition for not introducing unwanted harmonics during re-quantization is that the total error is an i.i.d. sequence. The reason for this is that an i.i.d. sequence has a white spectrum. As $x_q[n]$ is the sum of $x[n]$ and $\epsilon[n]$, if $\epsilon[n]$ is white, then $x_q[n]$ is simply the original sequence $x[n]$ with added white noise. The tests presented here evaluate the whiteness, or equivalently, the independence of $\epsilon[n]$ and $\epsilon[n+k]$ for all $k \neq 0$.

Because $\epsilon[n]$ is a finite signal, its statistics must be estimated from a finite number of samples. If N samples are used to calculate the estimates, its sample mean and variance can be defined as:

$$\hat{\mu}_\varepsilon = \frac{1}{N} \sum_{n=0}^{N-1} \varepsilon(n)$$

and $$\hat{\sigma}_\varepsilon^2 = \frac{1}{N} \sum_{n=0}^{N-1} (\varepsilon(n) - \hat{\mu}_\varepsilon)^2$$

respectively. Similarly, the sample autocorrelation sequence is given by $$\hat{p}_\varepsilon'(k) = \begin{cases} \frac{1}{N} \sum_{p=0}^{N-k-1} \varepsilon(n+k)\varepsilon(n), & 0 \leq k \leq N-1 \\ \hat{p}_\varepsilon(-k), & -(N-1) \leq k \leq 0 \\ 0 & \text{else.} \end{cases}$$

If $\epsilon(n)$ has zero mean, then the sample autocorrelation coefficient can be defined as $$p_\varepsilon'(k) = \frac{\hat{p}_\varepsilon}{\hat{\sigma}_\varepsilon^2}.$$

Figure 8:
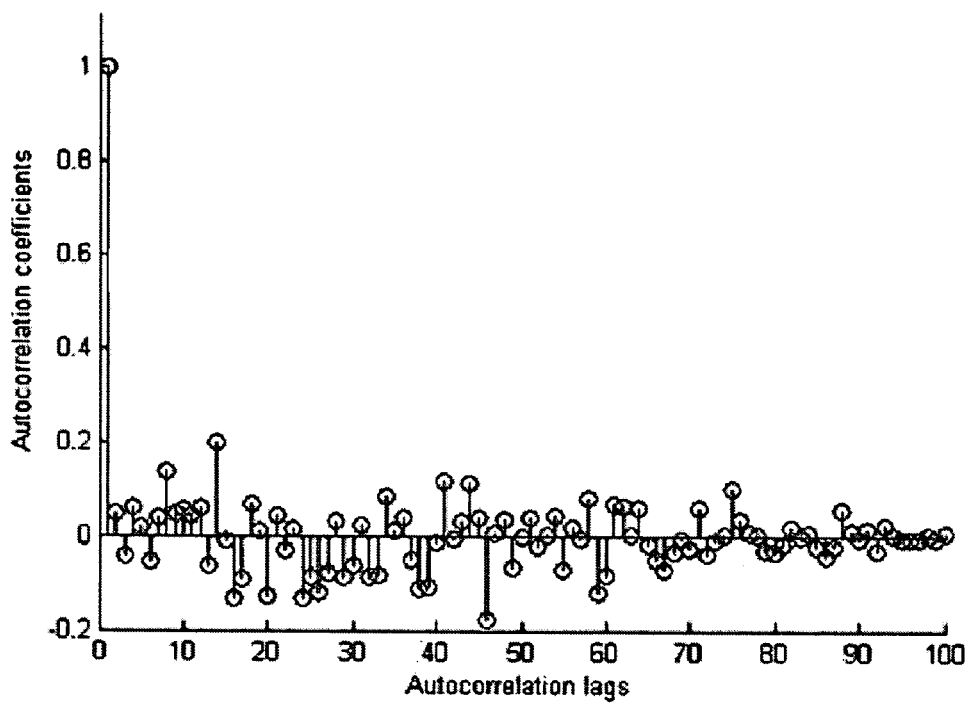
FIG. 8 shows a graph of a sample white noise's autocorrelation.

The autocorrelation coefficient at lag k gives a measure of the linear dependence between $\epsilon[n]$ and $\epsilon[n+k]$. If $\epsilon[n]$ and $\epsilon[n+k]$ are independent, then the correlation, and the correlation coefficient will be zero. Thus, a necessary condition for the independence of a sequence is that its sample autocorrelation coefficient be zero for all $k \neq 0$. The tests in the time domain presented here are based on using the sample autocorrelation coefficient to determine if the sequence is independent. Because of the finite number of samples used in the estimation, the sample autocorrelation and autocorrelation coefficient will never be exactly zero. A typical sample autocorrelation coefficient is shown in FIG. 8.

Box-Pierce Test

The Box Pierce Test ($Q_{bp}$) statistic (incorporated herein by reference) is used to verify the null hypothesis of white noise. This test uses the first m lags of the autocorrelation coefficient to calculate the following statistic:

$$Q_{bp} = N \sum_{k=1}^{m} T_k^2.$$

$Q_{bp}$ asymptotically approaches a $\chi^2$ distribution with m degrees of freedom for increasing N under the null hypothesis of a white noise signal. In order to make the $Q_{bp}$ statistic closer to its asymptotic distribution, the number of lags must be smaller than the number of samples.

To improve the performance of the test, the error signal is scaled between $-1$ and $1$ and the mean is subtracted. This test is useful to measure when the signal has autoregressive or moving average components. The Box-Pierce statistic has some problems with the approximation to its asymptotic distribution, and the following test modifies the statistic to achieve a better approximation.

Ljung-Box Test

This test is a modification introduced to the Box-Pierce test. This test has proven more effective when the signal being tested comes from a non-normal distribution. Using the autocorrelation estimator, the statistic is now defined by:

$$Q_{bp} = N(N+2) \sum_{k=1}^{m} \frac{r_k^2}{N-k},$$

where m is the number of lags. Similar to the Box-Pierce test, the distribution asymptotically approaches that of a $\chi^2$ with m degrees of freedom. Also, the performance of the test is improved when N is larger than m.

Test in the Frequency Domain

The tests in the time domain are based on the sample autocorrelation. Similarly, tests in the frequency domain are based on the Fourier transform of the sample autocorrelation, the sample power spectral density. The autocorrelation of a white sequence is an impulse, so its Fourier transform is a constant; it is the variance of the signal:

$$r_e(k)=\sigma_e^2\delta(k) \Leftrightarrow PSD_e(\omega)=\sigma_e^2.$$

Thus, the test in the frequency domain is used to determine if the PSD of the sequence $\epsilon[n]$ is a constant. Two modifications to the above equation are made in practice. The sample autocorrelation is used because the signal is finite, and the DFT is used instead of the DTFT for ease of computation. The equation for the PSD estimate, the sample PSD, then becomes $$PSD_q(l) = \sum_{k=-\delta+1}^{N-1} r(k)e^{-j\frac{2\pi}{N}kf}.$$

Figure 9:
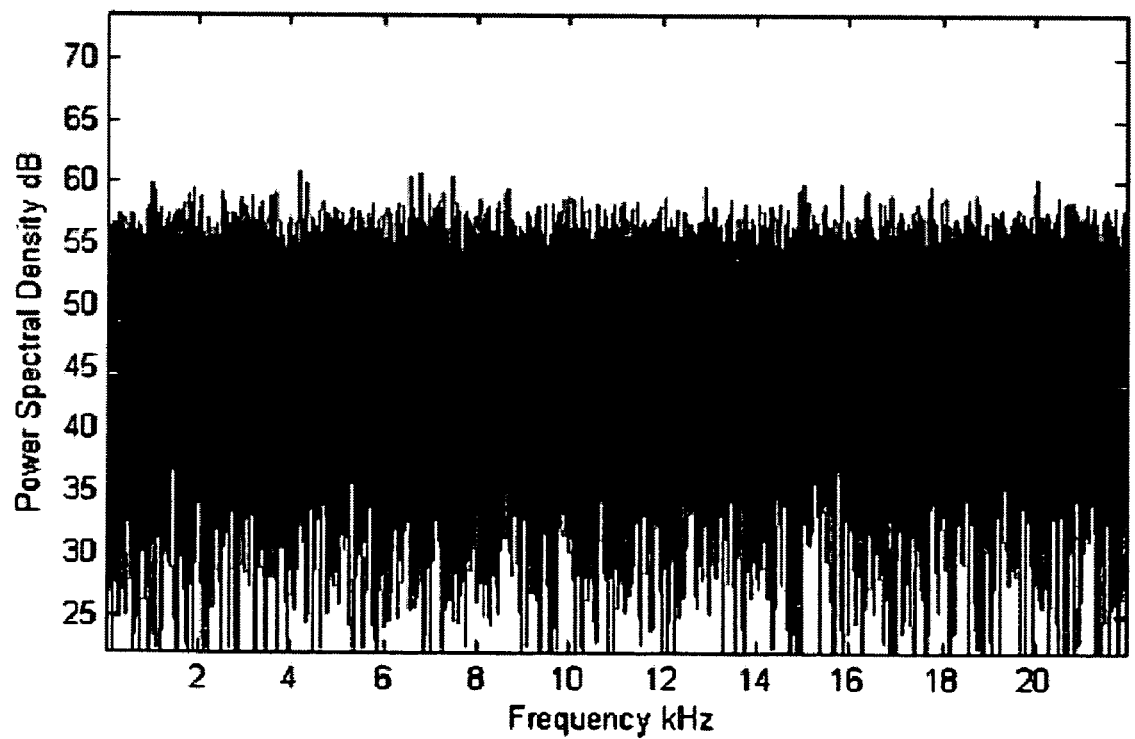
FIG. 9 shows a graph of the power spectral density of a white noise signal.

FIG. 9 shows the power spectral density of a white noise signal with 1000 samples. As with the autocorrelation, the sample PSD is not constant. Previous studies presented spectral response of time series. In these studies, the PSD is defined using the data directly instead of its sample autocorrelation. This is given by:

$$A(l) = \sum_{n=-N}^{N-1} \varepsilon[n]\cos\left(\frac{2\pi}{N}\right),$$

$$B(l) = \sum_{n=-N}^{N-1} \varepsilon[n]\sin\left(\frac{2\pi}{N}\right), \text{ and}$$

$$F(l) = \frac{1}{N}(A^2(l) + B^2(l)), -\frac{N}{2} < l < \frac{N}{2},$$

where F is the PSD estimator. The estimator is the square of the norm of the DFT since the exponential can be defined using sine and cosine functions as follows:

$$e^{\frac{2\pi knj}{N}} = \cos\left(\frac{2\pi knj}{N}\right) + j\sin\left(\frac{2\pi knj}{N}\right) \text{ and}$$

$$\left|e^{\frac{2\pi knj}{N}}\right|^2 = \left(\cos\left(\frac{2\pi knj}{N}\right)\right)^2 + \left(\sin\left(\frac{2\pi knj}{N}\right)\right)^2.$$

In those previous studies, the following modification to F(k) is suggested.

$$Y(k) = \frac{2F(k)}{\sigma_x^2}.$$

With a large N, Y(k) has a $\chi^2_2$ distribution. If the variance of the sequence is unknown (i.e., the common case), it can be substituted by the sample variance. Knowing the distribution of the signal under the null hypothesis, a goodness of fit test is used to determine if the signal has a $\chi^2_2$ distribution. Some typical goodness of fit tests are the Kolmogorov-Smirnov and the Pearson $\chi^2$ test. The former is used in this invention.

Adaptive Dither

One of the main contributions of this invention is a methodology to obtain an adaptive dither which depends on the signal being quantized. This signal dependent dither must have a total error with a constant variance as does TPDF dither. Also, this signal dependent dither must have less variance of the total error, and so less noise, than the typical TPDF dither. To obtain this dither, many statistical approaches were tried without good results. One of them linearizes the quantizer to deconvolve the PDF using an extended Gaussian Mixture Model approach. As none of the statistical methods gave satisfactory results, a numerical approach is proposed to find a dither signal using optimization methods.

The mathematical problem statement and two methods for obtaining a solution will be described.

Adaptive Dither Problem Statement

Let the quantized signal be defined as:

$$x_q[n] = Q_r\left(\frac{x[n]}{2^m} + d[n]\right)2^m,$$

where $Q_r(x)$ is the rounding operation, and m is the quantization level, x[n] is the input signal, and d[n] the dither signal. The goal is to find a dither d[n] which has a total error with a white spectrum and constant variance. If x[n] is originally an integer, then $x=x[n]/2^m$ has an integer and a fractional part. Let the scaled input signal be defined as:

$$\chi[n] = \frac{x[n]}{2^m} = x_i[n] + x_f[n],$$

where $x_i[n]$ is the integer part and $x_f[n]$ is the fractional part. The rounding operation is a non-linear process in which the number is approximated to nearest integer. If the input to Q, has integer parts, they are not affected by the quantizer. This is used to re-write the quantized signal equation and the scaled input signal equation in the below equation. $x_f[n]$ is fractional and must be evaluated with the dither d[n] which is unknown so the quantized signal equation becomes:

$$x_q[n]=Q_r(x_i[n]+x_f[n]+d[n])2^m=(x_i[n]+Q_r(x_f[n]+d[n]))2^m.$$

In addition, the scaled quantization error signal is the difference between the input signal and the quantized signal divided by r as shown in the following equation:

$$\epsilon[n] = \underbrace{\frac{x[n] - x_q[n]}{2^m}} = \chi[n] - \frac{x_q[n]}{2^m}.$$

Replacing and using the above equations, the following expression is obtained:

$$\epsilon[n] = \underbrace{x_i[n] + x_f[n]}_{\chi[n]} - \underbrace{x_i[n] - Q_r(x_f[n] + d[n])}_{x_q[n]2^{-m}},$$

$$\epsilon[n] = x_f[n] - Q_r(x_f[n] + d[n]).$$

At this point, it is clear that the total error only depends of the fractional part of x[n]. Hence, the integer part can be ignored for purposes of this invention. As previously described, the autocorrelation of the error is used to measure whether it is white noise and the white noise autocorrelation is an impulse at lag zero. The desired error autocorrelation for lags 0 to N−1 is given by:

$$f(d) = \begin{bmatrix} f_0(d) \\ f_1(d) \\ f_2(d) \\ f_k(d) \\ f_{N-1}(d) \end{bmatrix} =$$

$$\begin{bmatrix} \epsilon[0]\epsilon[0] & + & \epsilon[1]\epsilon[1] & + & \ldots & + & \epsilon[N-1]\epsilon[N-1] \\ 0 & + & \epsilon[0]\epsilon[1] & + & \ldots & + & \epsilon[N-2]\epsilon[N-1] \\ 0 & + & 0 & + & \ldots & + & \epsilon[N-3]\epsilon[N-1] \\ \vdots & & & \ddots & & & \\ 0 & + & \ldots & + & 0 & + & \epsilon[0]\epsilon[N-1] \end{bmatrix} = \begin{bmatrix} N\sigma^2 \\ 0 \\ 0 \\ \vdots \\ 0 \end{bmatrix}$$

where d is the dither vector. Note that the system of equations depends of $\epsilon$ and this depends on $x_f$ and d, but $x_f$ is a known constant. Furthermore, the system is clearly non-linear because it has quadratic expressions. Moreover, $\epsilon[n]$ depends on $Q_r(x)$ which is non-linear. Similar to other non-linear systems, the above system can be solved using an optimization algorithm such as Gauss-Newton or Steepest Descent. To linearize the system, popular optimization algorithms use derivatives or a finite approximation of them, and $Q_r(x)$ is not differentiable, as can be seen in FIG. 4. Thus, a smooth continuous function is needed for the linearization.

In this invention, an approximation is used for the linearization. The simplest estimator of $Q_r(x)$ is to linearize $$\hat{Q}_r(x) = x, \text{ so } \frac{d\hat{Q}_r(x)}{dx} = 1.$$

This approximation shows good results as will be explained later.

Lenvenberg-Marquardt Algorithm for Adaptive Dither

Levenberg-Marquardt (LM) is an iterative optimization algorithm that can be used to find a solution which minimizes a system of non-linear functions. It is popular because it has a double behavior as a Gauss-Newton method and as Gradient Descent. In this invention the LM algorithm is used to iteratively obtain the dither vector d. In this algorithm, the update rule to obtain d is given by:

$$d_{k+1} = d^k + \alpha$$

For small values of α and using the first order Taylor expansion to approximate f(d) this becomes:

$$f(d) = f(d+\alpha) - J(d)\alpha,$$

where J is the Jacobian matrix. Denoting the iteration error as e=f(d)−f(d+α), where d is the optimum solution, it is desired that the error decreases during each iteration. Hence, it is necessary that $\|e\|^2 = e^T e$ be minimum. Applying the above equation to the iteration error gives:

$$\|e\|^2 = \|f(d) - f(d) - J(d)\alpha\|^2.$$

Taking the first derivative with respect to α and setting it equal to zero gives the equation below. This equation is called the normal equation:

$$J^T(d)J(d)\alpha = J^T(d)(f(d) - f(d)).$$

Subsequently, α is obtained solving this linear system. Modifying this equation, Levenberg and later Marquardt propose a variation to the normal equations which are called the augmented normal equations:

$$N\alpha = J^T(d)(f(d) - f(d)),$$

where $N = \mu I + J^T(d)J(d)$. The constant μ is called the damping parameter and it is always positive. The algorithm assumes an initial μ and α. If the error is reduced for a given value of α, then d is updated, μ is decreased and a new iteration begins. On the other hand, if the new α increases the error, then μ is increased and α is recalculated. This procedure is repeated until the error is decreased. When the d is updated the entire process is repeated until the error or the relative change of α are below of a threshold or a maximum number of iterations is reached.

The LM algorithm is said to have a double behavior. This is because when μ is decreased (and it is small) it converges as a Gauss Newton method. In contrast, if μ increases then it converges as a Gradient Descent method. In the case of dither, it is important that the value of d[n] will be limited in its values to assure that converges to an optimum solution. For this reason, it is necessary to add box constraints (i.e, upper and lower bounds) to the original LM algorithm. Another reason is that the approximations of Q(x) are made in the region between −4Δ and 4Δ. A modification to this method to operate under a set of constraints will be explained later.

The solution dither vector d shows high correlation between different audio frames when the system f(d) is solved using LM. The circular autocorrelation estimator is proposed as a method to eliminate this correlation between frames. Let the circular autocorrelation estimator at lag L be defined as:

$$f_L(d) = \sum_{n=0}^{N-1} \epsilon(\langle n-L \rangle_N) \epsilon(n),$$

where $(\alpha)_N$ is the modulus operation. The circular autocorrelation is symmetric at lag N/2, so the N equations are not linearly independent causing an error in the optimization libraries. In this case, the system is underdetermined (i.e, less equations than variables) and it is necessary to add more equations to solve it using the same software as before. Assuming that the first frame of length N is analyzed and the total error computed, the next frame is analyzed using N/2 samples of the total error calculated and N/2 samples of the frame to be analyzed. The system with circular autocorrelation has N samples, N/2 unknown variables, N/2 know variables and N/2 equations. The equation below presents the new system of equations for the LM algorithm.

$$f(d) = k \begin{bmatrix} \epsilon_{kn}[0]\epsilon_{kn}[0] & + & \epsilon_{kn}[1]\epsilon_{kn}[1] & + & \ldots & + & \epsilon_u[N-2]\epsilon_u[N-2] \\ \epsilon_u[N-1]\epsilon_{kn}[0] & + & \epsilon_{kn}[0]\epsilon_{kn}[1] & + & \ldots & + & \epsilon_u[N-2]\epsilon_u[N-1] \\ \epsilon_u[N-2]\epsilon_{kn}[0] & + & \epsilon_u[N-1]\epsilon_{kn}[1] & + & \ldots & + & \epsilon_u[N-3]\epsilon_u[N-1] \\ \vdots & & \ddots & & & & \\ \epsilon_u\left[\frac{N}{2}\right]\epsilon_{kn}[0] & + & \epsilon_u\left[\frac{N}{2}+1\right]\epsilon_{kn}[1] & + & \ldots & + & \epsilon_{kn}\left[\frac{N}{2}\right]\epsilon_u[N-1] \end{bmatrix} = k \begin{bmatrix} N\sigma^2 \\ 0 \\ \vdots \\ 0 \end{bmatrix}$$

where $\epsilon_u$ and $\epsilon_{kn}$ are the unknown and known error samples respectively.

Box Constrained Levenberg-Marquardt Algorithm This algorithm was proposed by Kanzow, Yamashita and Fukushima (incorporated herein by reference). The algorithm is called a projected Levenberg-Marquardt (PLM) method because d is a projection onto the desired constrained space. This space is a set of upper and lower bounds for the vector d. The update rule in PLM is defined as the projection onto the desired region.

The update sequence is given by:

$$d^{k+1} = P_X(d^k + \alpha),$$

where $P_x$ is the projection operation. Similar to the unconstrained LM algorithm, if the error is reduced, then μ is reduced and a new iteration begins. Otherwise, the updated value is defined as $d = P_x(d^k - t_k J^T(d))$, where $t_k$ must be well chosen to have an error in decreasing direction.

Spectral Projected Gradient Optimization

Spectral projected gradient (SPG) is an algorithm which minimizes an objective function in a closed region, in this method denoted a box. The method is a modification to the Barzain-Borwein gradient descent algorithm. The algorithm was introduced and later modified by Birgin, Martinez and Raydan (incorporated herein by reference). The method has the following objective function:

$$F(d) = \frac{1}{2}\sum_{i=0}^{N-1}(f_i(d))^2 = \frac{1}{2}\|f(d)\|^2 = \frac{1}{2}f(d)^T f(d).$$

Similar to LM, the spectral projected gradient finds a vector d which minimizes the objective function. The update rule to obtain d is given by:

$$d^{k+1} = d^k + \zeta p^k,$$

where $\zeta$ is the step size and $p^k$ is the search direction defined as:

$$p_k = p_x\left(d^k - \frac{1}{\kappa_k}\nabla F(d^k)\right) - d.$$

The parameter $\kappa^k$ is obtained using the Barzain-Borwein gradient descent method where the parameter is estimated using the slack variables, $S^k = x^{k+1} - x^k$ and $y^k = F(d^{k+1}) - F(d^k)$. Therefore, the factor is given by:

$$\kappa^{k+1} = \frac{(s^k)^T y^k}{(s^k)^T s^k}.$$

Note that κ can take any positive value. To avoid very large or very small values of κ, the method inserts an upper and lower bound. Therefore, the parameter becomes:

$$\kappa^{k+1} = \min\left\{\kappa_{max}, \max\left\{\kappa_{min}, \frac{(s^k)^T y^k}{(s^k)^T s^k}\right\}\right\}.$$

Finally, the vector is calculated using a non-monotone line search. In this line search, $\zeta_k$ is found if $F(d^{k+1}) \leq F_{max} + \gamma\zeta_k F(d^k)^T P_k$, where $\gamma$ [0, 1]. Otherwise, the value is iteratively obtained using the following update rule:

$$\zeta_{tmp} = -\frac{1}{2}\frac{\zeta^2 \nabla F(d^k)^T p_k}{F(d^{k+1}) - F(d^k)}.$$

If $\zeta_{tmp}$ is between the upper and the lower bound of κ then $\zeta^k = \zeta_{tmp}$, otherwise, $\zeta = \zeta/2$.

The following description explains several experiments defining the need for dither and adaptive dithering in one dimensional signals. Experiments with synthetic and real audio were performed to determine if the total error is white noise. In addition, examples of the effectiveness of the methods when the data comes from AR, MA and ARMA process are shown. Then, adaptive dither in synthetic and real audio is presented. The experiments were designed to test if adaptive dithering reaches the desired variance in the total error at different levels of quantization and at different values in the desired variance.

Experiments for Measuring the Need for Dither

The purpose of these experiments was to test the algorithms previously described which measure the need for dither. The experiments are statistical based hypothesis testing. This type of test has two types of error: saying the null hypothesis is false when it is true (type I error) and saying it is true when it is false (type II error). The tests are typically designed to have a user defined type I error. This methodology is used here and the type I error has been set at 10%. The null hypothesis in these experiments is that the signal is white noise. Thus, the error level has been selected so that 10% of the time the signal will be said to be not white when it really is.

Experiments Using an AR Process

Figure 10:
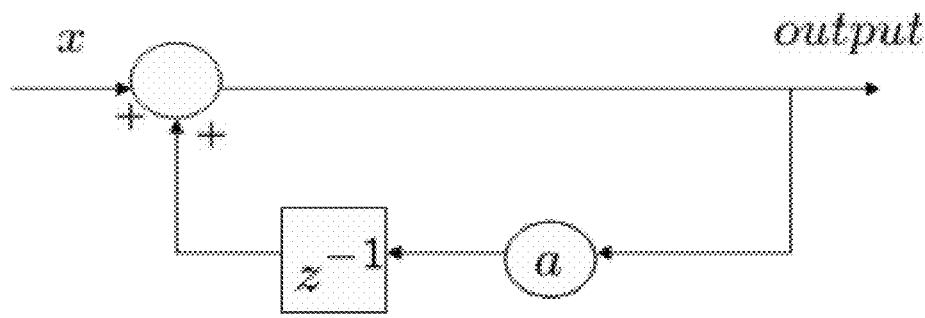
FIG. 10 illustrates an autoregressive process scheme.

The experiments explained are designed to test the relative performance of the different tests with synthetic data. The performance of the hypothesis tests when the data comes from an autoregressive process will be measured as shown in FIG. 10. The term $z^{-1}$ in FIG. 10 is a delay in time domain, so, the linear difference equation is given by o[n]=x[n]+ao[n−1], where o is the output of the AR process.

The level of the constant a controls the relative level of whiteness of the output signal. The input signal is a zero mean white noise uniformly distributed with 10000 samples. The two time domain tests and the frequency domain test previously explained are used to test the output signal as the constant a is varied from 0 to 1. As can be seen from FIG. 11, when the constant is set to zero the output is white noise, and as the constant increases the relative whiteness of the output signal decreases. The three tests reject the null hypothesis of white noise for relatively small values of a.

Figure 11:
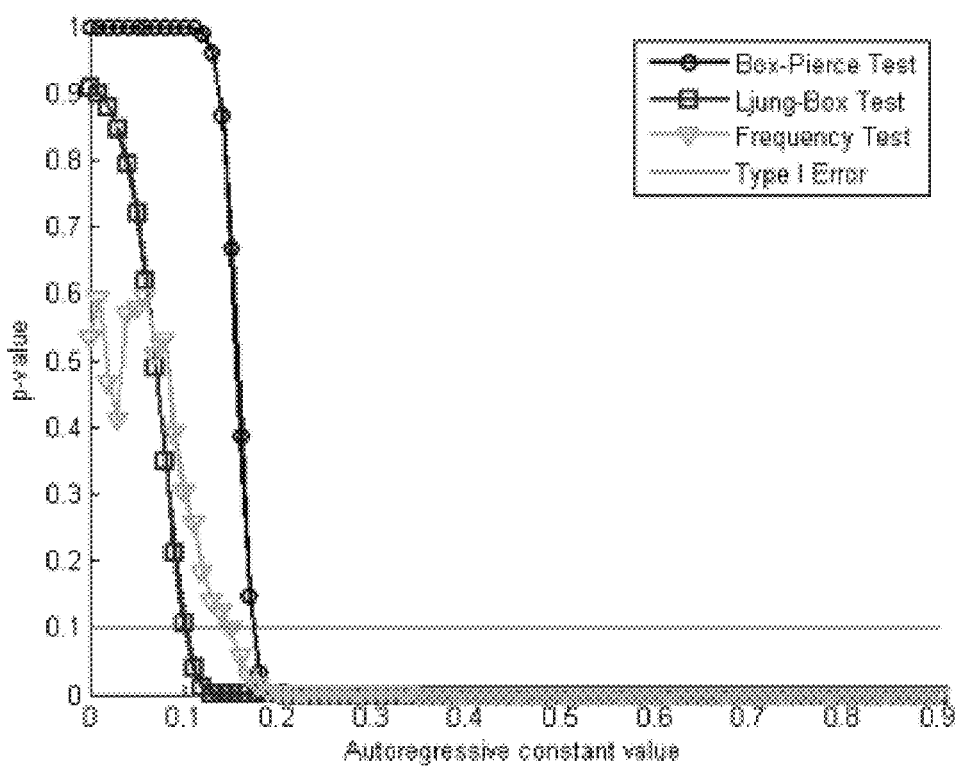
FIG. 11 is a graph showing the P-values of different tests against a p-value threshold.

The probability value (p-value) in FIG. 11 can be interpreted as the probability of getting a value of the test statistic as extreme as or more extreme than that observed by chance alone under the null hypothesis. In this case, the three tests are fairly close, with the Ljung-Box test correctly identifying the signal as being non-white when the magnitude of a is only about 0.2.

Experiments Using an Ma Process

Figure 12:
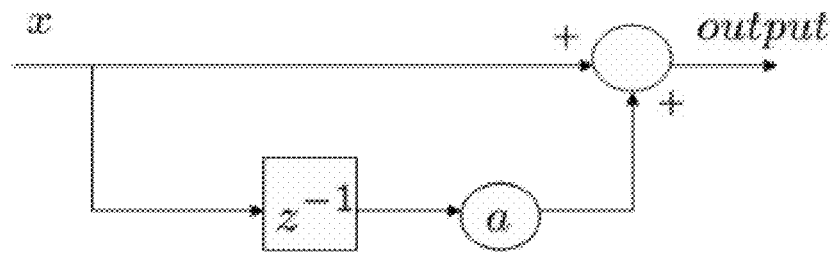
FIG. 12 illustrates a moving average process scheme.

The purpose of this experiment was to evaluate at what level of whiteness the tests reject the null hypothesis when the data comes from a moving average process. This experiment uses synthetic data from a first order moving average process as shown in the FIG. 12. In this case, the linear difference equation is given by o[n]=x[n]+ax[n−1].

Figure 13:
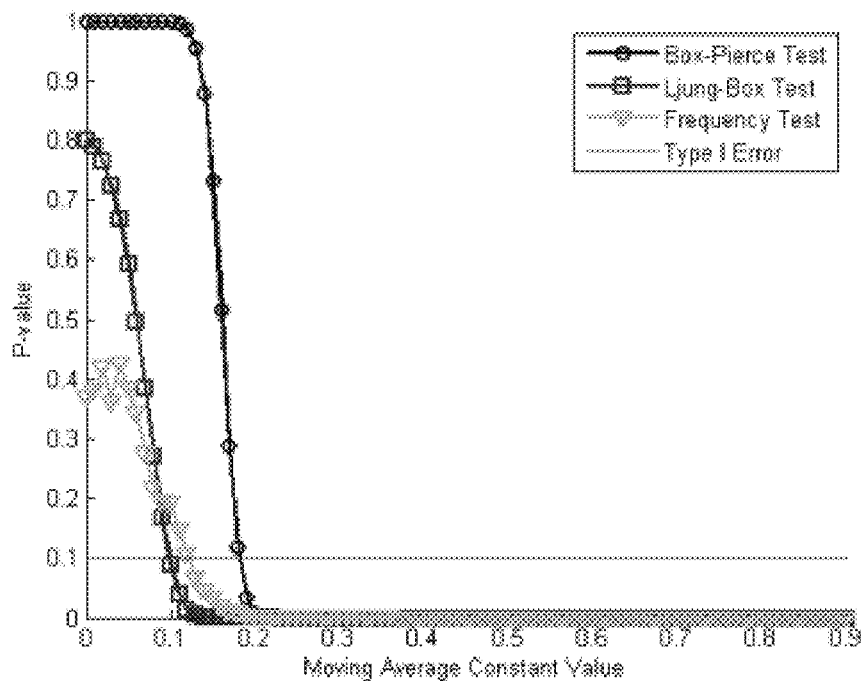
FIG. 13 is another graph showing the P-values of different tests against a p-value threshold.

Similar to the AR process, the constant a controls the level of whiteness of the MA process. The input signal is zero mean white noise with 10000 samples. As shown in FIG. 13, when the constant a is close to zero the white noise tests does not reject the null hypothesis. On the other hand, when the constant is increased the white noise tests reject the null hypothesis. The Ljung box test is the best test because it rejects the null hypothesis for a smaller value of a than the other tests.

Experiments Using an ARMA Process

Figure 14:
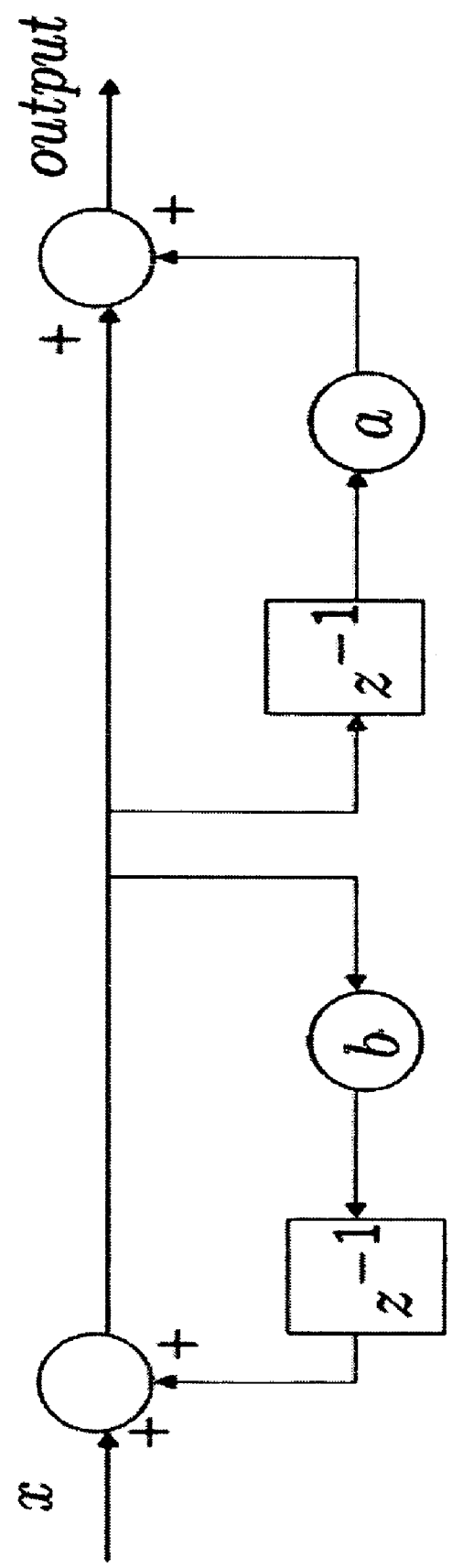
FIG. 14 illustrates an ARMA process scheme.

Analogous to the MA and AR process, the goal of this experiment is to evaluate the different tests when the data comes from a first order ARMA process. The input signal has the same characteristics of the last experiment. The process generation is shown in FIG. 14. Note that the ARMA process is the concatenation of an AR process and an MA process, so, its linear difference equation is given by o[n]=x[n]+ax[n−1]+bo[n−1].

Figure 15:
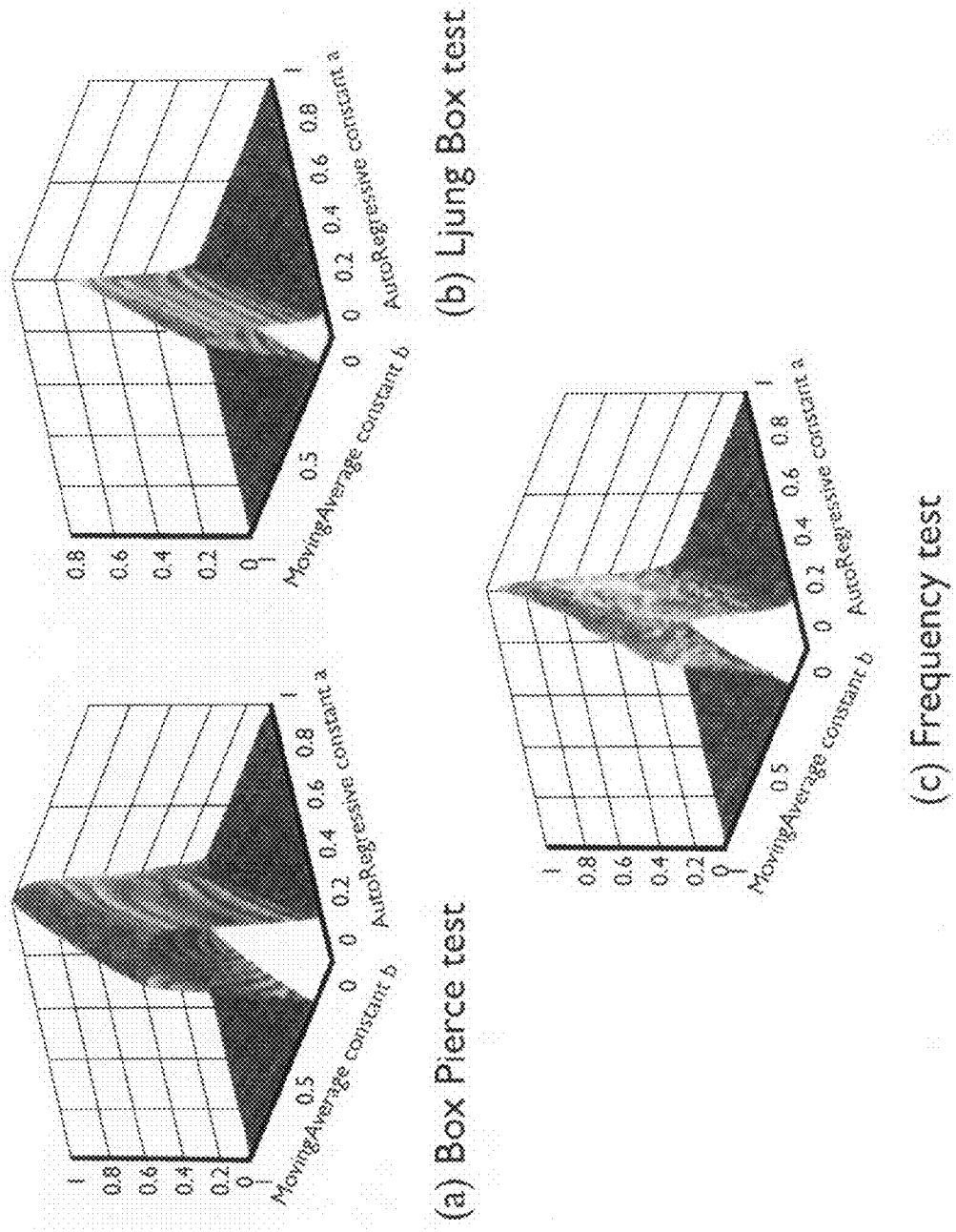
FIG. 15 shows 3D plots of a white noise test in an ARMA signal.
Figure 16:
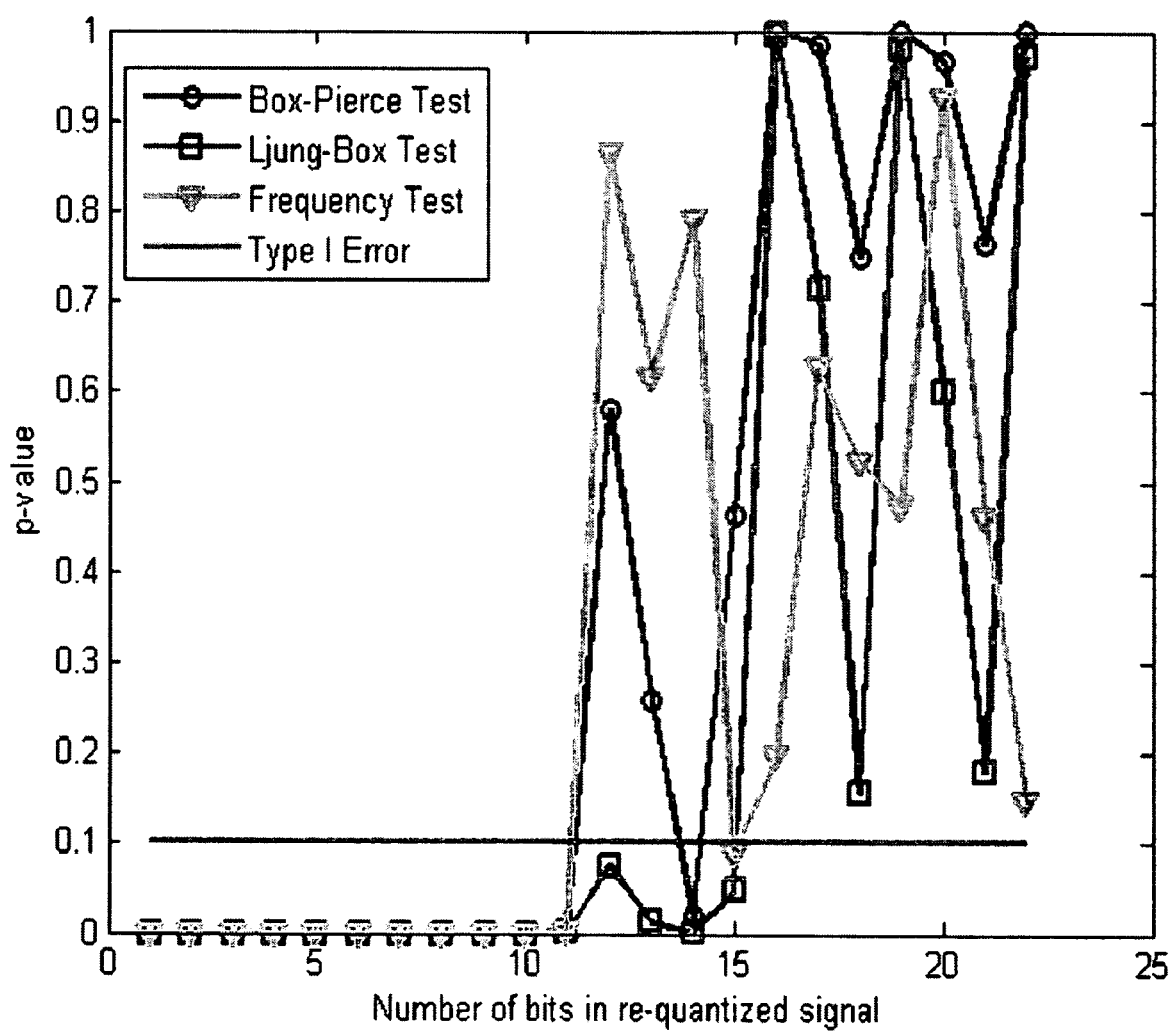
FIG. 16 is a graph showing P-values of different levels of quantization for a sine signal.

In this case, the signal is controlled using an autoregressive constant a and the moving average constant b. The results of varying the constants a and b between 0 and 1 are shown in FIG. 15. When the constants are near zero, the output is white noise, and as the constants increase, the relative whiteness of the output signal decreases. When the constants a and b are the same, the signal is white noise. This is because the pole and the zero of the transfer function cancel when they are the same. The Ljung Box test is better than the other tests because it rejects the null hypothesis at smaller values of a and b than the Box-Pierce and Frequency Test.

Audio Experiments

Experiments Using Synthetic Audio

This set of experiments use a full scale 1333 Hz cosine wave with 24 bit precision. Each segment has a length of 10000 points and 1250 lags are used in the autocorrelation tests.

Figure 17:
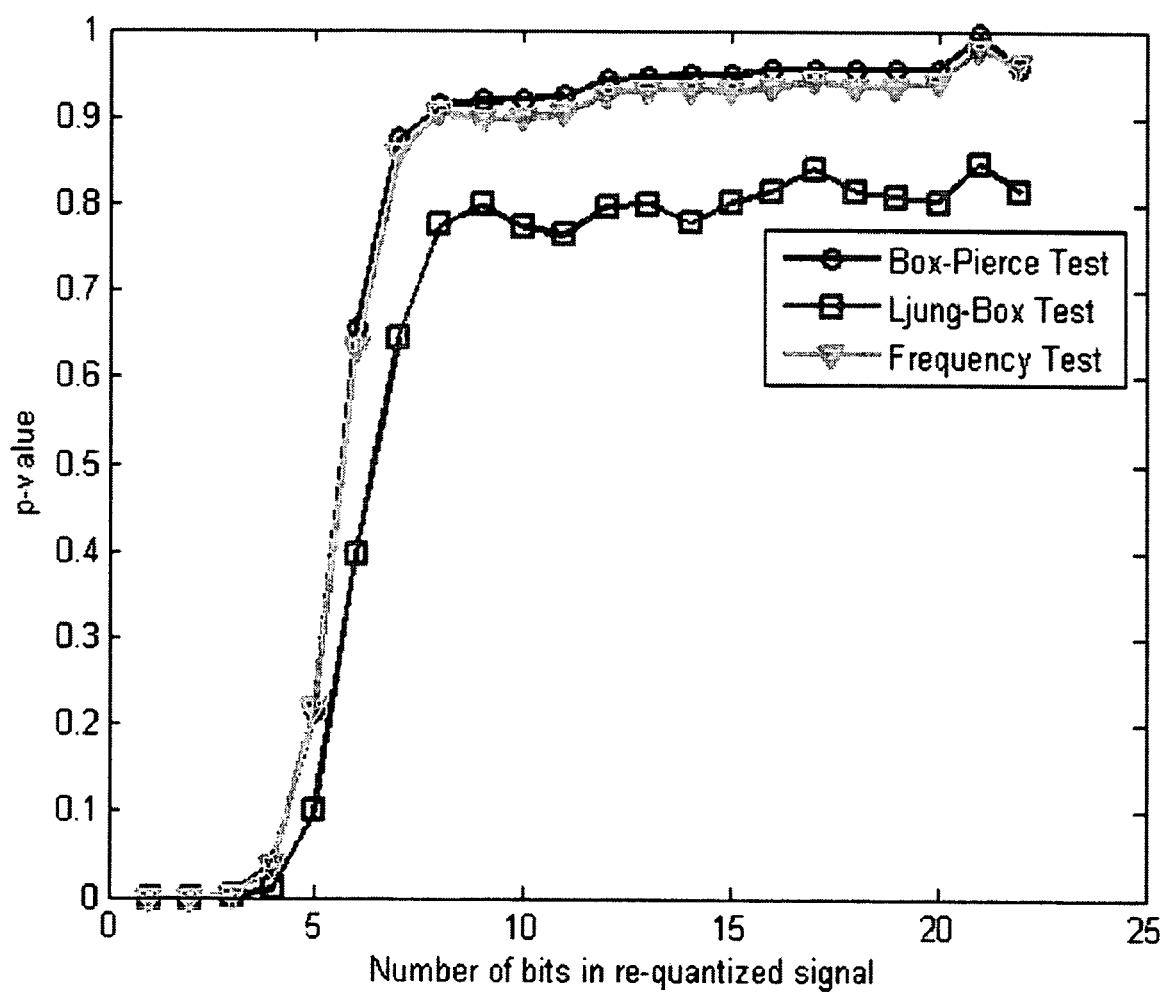
FIG. 17 is a graph showing the percentage of frames accepted as having white quantization noise on a signal.

This first experiment was done to determine at what bit level the quantization noise ceases to be white. Here the signal is re-quantized to different bit levels varying from 22 down to 1 bit. As can be seen in FIG. 17, the tests have p-values above 0.1 until the signal is quantized around to 16 bits. At this point the p-values of the tests begin to decrease, each one showing that the total error is no longer white when the signal is re-quantized to values between 12 and 14 bits. Below to 12 bits the hypothesis test has p-values near to zero. The Box-Pierce test is the most monotonic, with the Frequency test having the most ripples near the hypothesis rejection level translating in less stability in its rejection.

Another experiment was performed using the same signal as before. The purpose was to observe the unwanted harmonics when the amplitude of the signal is changed. This experiment using synthetic audio uses a 1333 Hz cosine wave with 24 bit precision, and re-quantizes to either 16 or 12 bits. In this experiment, the amplitude of the cosine is decreased until unwanted harmonics appear in the re-quantized signal. It was found that the total error is classified as non-white before the harmonics are visible in the spectrum. When re-quantizing to 16 bits, the tests reject the null hypothesis when the cosine has been reduced to −20 dB or more. However, the harmonics are not visible in the PSD until the signal has been reduced by at least −20.9 dB of its maximum value. The results are similar when re-quantizing to 12 bits. The tests reject when the amplitude has been reduced by at least −10 dB, but visible harmonics appear when the amplitude has been reduced by at least to −13 dB.

Experiments Using Real Audio

The final experiments of this section used real audio with 24 bit precision and a 44.1 kHz sampling rate. Since an audio signal can change over time, the procedure is to segment the signal, and apply the tests on each segment. This is done to strengthen the stationary assumption. As in the previous test, each segment is 10000 samples in length, and the autocorrelation tests used a lag of 1250. The purpose of this experiment is to determine the number of frames that are rejected at different levels of quantization. This is done because it is assumed that an increase in the resolution produces a decrease in the number of rejected frames. For this experiment the audio signal has 711 frames.

FIG. 17 shows the percentage of frames that were accepted when the requantized signal has q bits of precision. As can be seen in the Figure, the general tendency is that re-quantizing to a large number of bits has a white noise total error, and the opposite for re-quantizing to a small number of bits. As can be expected, there are frames that were accepted by one test and rejected by another.

Figure 18:
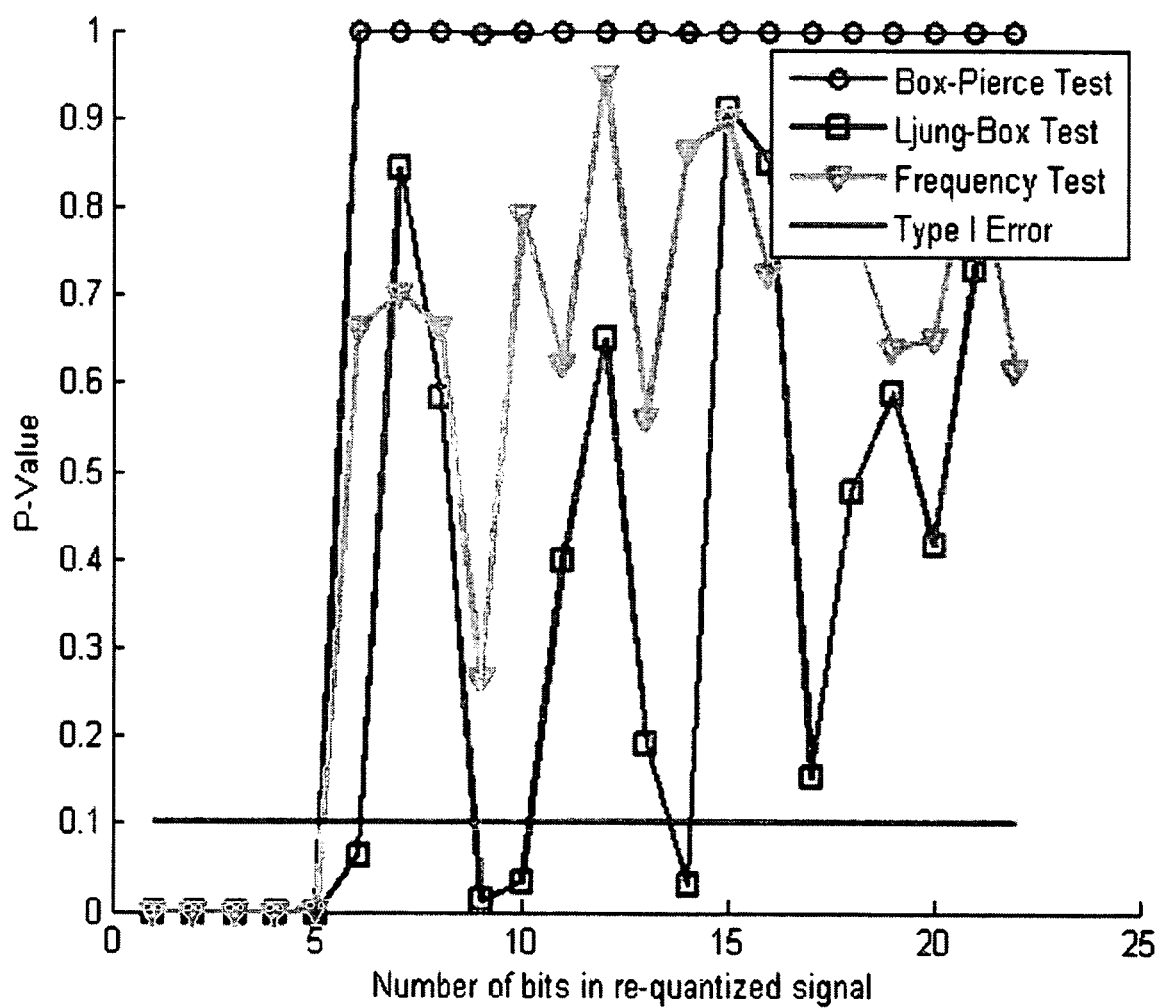
FIG. 18 is a graph showing P-values of one frame at different quantization levels.

A second experiment was performed in real audio to know at what bit depth in the re-quantized signal the tests do not reject the null hypothesis. In addition to looking at all the frames together, a study of only one frame was made. This frame was selected randomly and the same tests as above were performed for different re-quantization levels. The results are shown in FIG. 18. As can be seen in the Figure, the Box-Pierce test is again the most monotonic, with the frequency test having the most ripples. This suggests that the frequency test is less monotonic rejecting the null hypothesis than the autocorrelation tests.

Real Audio with Additive Dithering

Figure 19:
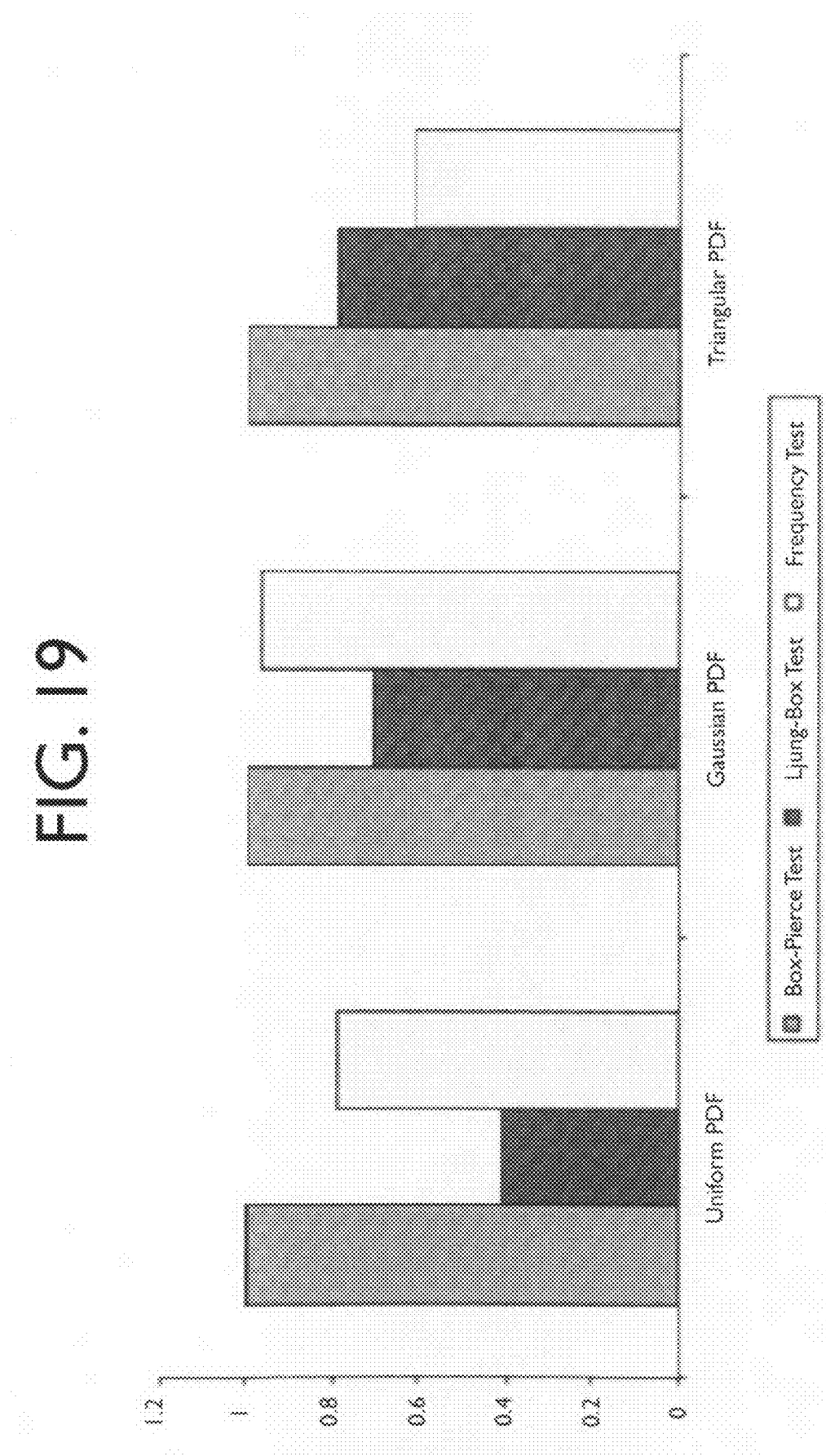
FIG. 19 shows the variance for different types of dithers.

If the tests previously proposed are used to measure white noise in the total error, then dither does not have to be added to the whole signal, only to the segments that do not pass the tests. As seen in the previous section, re-quantizing a segment to 4 bit resolution introduces unwanted harmonics and so does not have white total error. To see the effectiveness of adding dither, and if the test will show that the signal has been effectively dithered, the tests were run after adding dither. The results are shown in FIG. 19. The Figure shows that the dithered segment of real data has white total error. In addition, the total error is not rejected by the white noise hypothesis test, suggesting that dithering effectively uncorrelates the samples from the quantization total error.

An Application to Measure the Need for Dither

One of the objects of this invention is to implement the algorithms previously presented in Ansi C/C++. This was done because the compiled C code is faster than Matlab™ and other scripting languages. The program was written in Visual C++ and uses the GNU Scientific Library (GSL) for general mathematical functions. Other functions have been programmed in order to have the same functionality of Matlab™. The program processes a standard 24 bit audio file in WAV format. The program segments the input wave file into frames of 10000 samples. After that, it truncates each sample to 16 bits using a shift right operation. It then calculates the p-value of the Ljung-Box, Box-Pierce and frequency test. When any of the tests rejects the null hypothesis, dither is added to this frame. To avoid the abrupt change of noise in the signal, the program increases and decrease the noise level gradually.

Specifications

Figure 20:
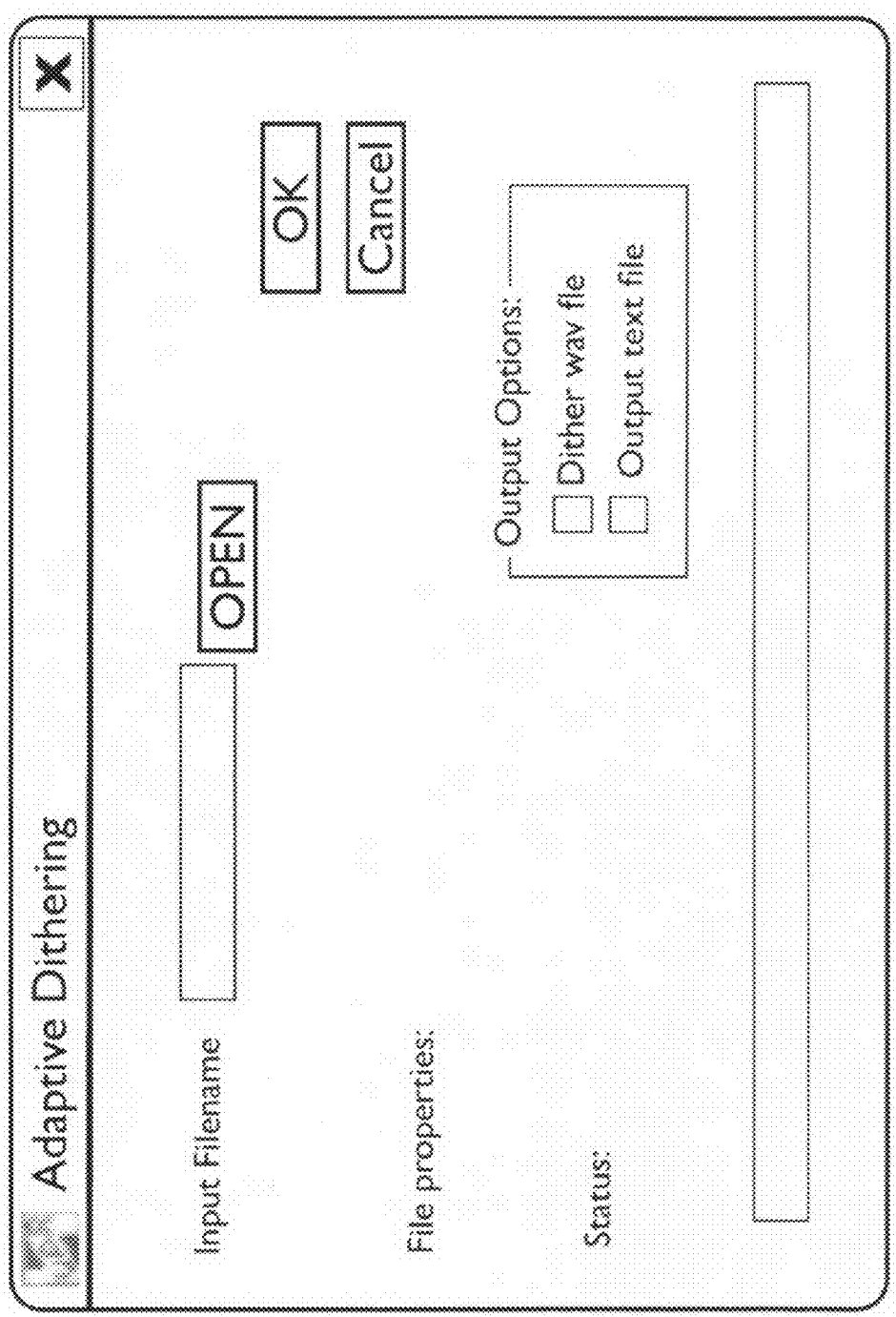
FIG. 20 shows a GUI window for an application to measure dither according to one embodiment of the invention.

FIG. 20 shows the application window according to the invention. The check box on the right of the Figure indicates the possible outputs of the program. These include the dithered wave file and the output text file that writes the frames that do not pass the tests.

In the file properties edit box, the program writes information about the sampling frequency, the number of samples and the number of channels (mono or stereo). Meanwhile, in the status edit box, the program indicates if the signal is being analyzed or the output file has been written.

Testing the Segment Dependent Dither C Program

Figure 21:
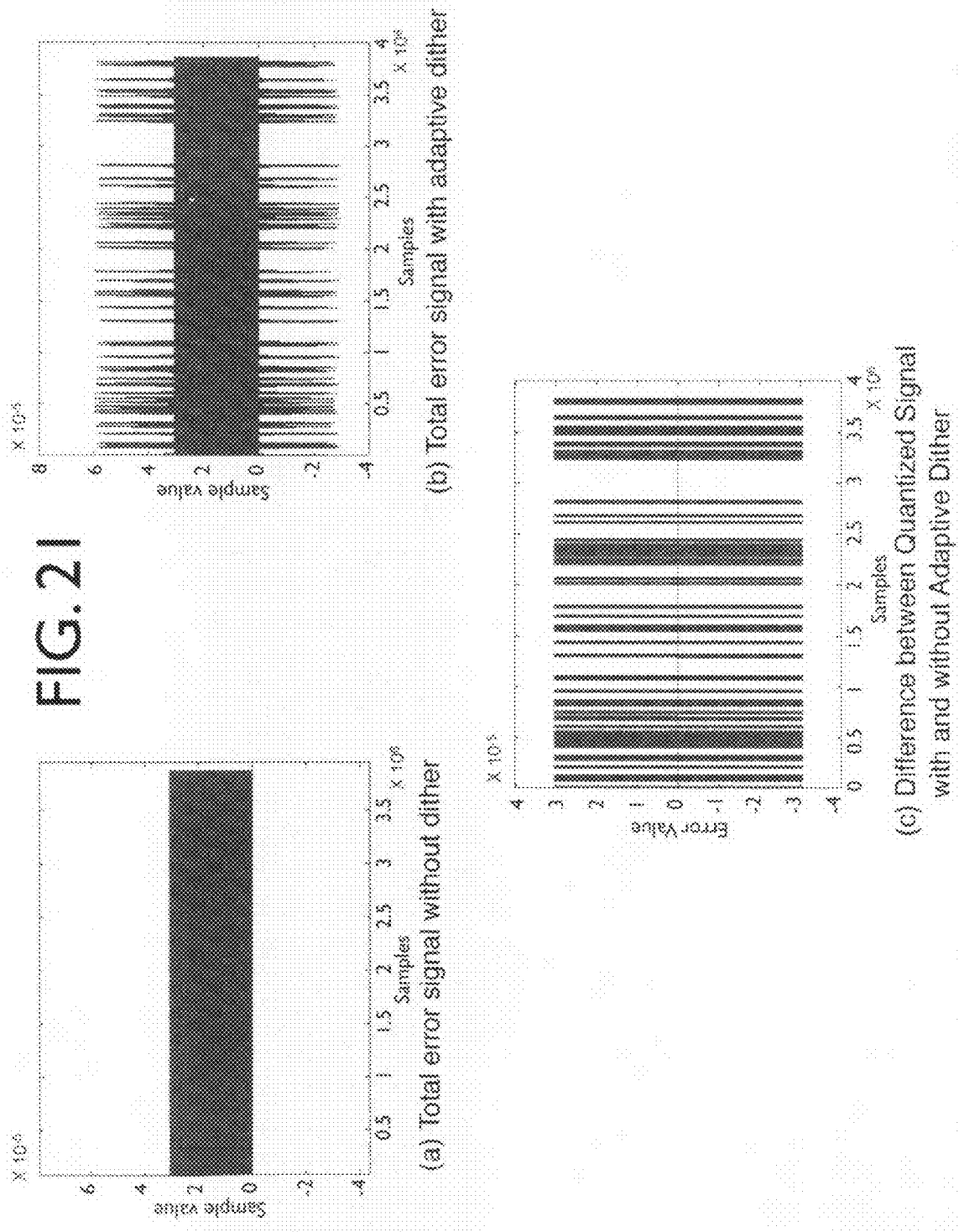
FIG. 21 shows graphs comparing an undithered quantized signal with a SDD quantized signal.

The following experiment evaluates if dither is added in the frames where the test rejects the white noise hypothesis. This experiment was done using real audio data. In FIG. 21, (b) and (a) show the total error signal with segment depended dithering and undithered quantization respectively. (c) shows the difference between these signals. In (c), it can be seen that when the total error has long periods of zero, meaning that in these sectors dither was not added. (b) shows that dither is added in some segments of the audio signal in contrast to (a) where the total error is uniform.

The following experiment is a comparison of the sample variance of the total error when the signal of (a) is quantized with different types of dither.

Table 1 below shows the variances of the total error in non-subtractive dithering scheme. As can be shown, the quantized signal with triangular PDF dither in the frames that do not pass the tests has the lowest variance.

| Dither | Variance |
| --- | --- |
| Uniform PDF | 0.1666 |
| Gaussian PDF | 0.1734 |
| Triangular PDF | 0.2502 |
| Frame dependent triangular PDF | 0.1182 |

Figure 22:
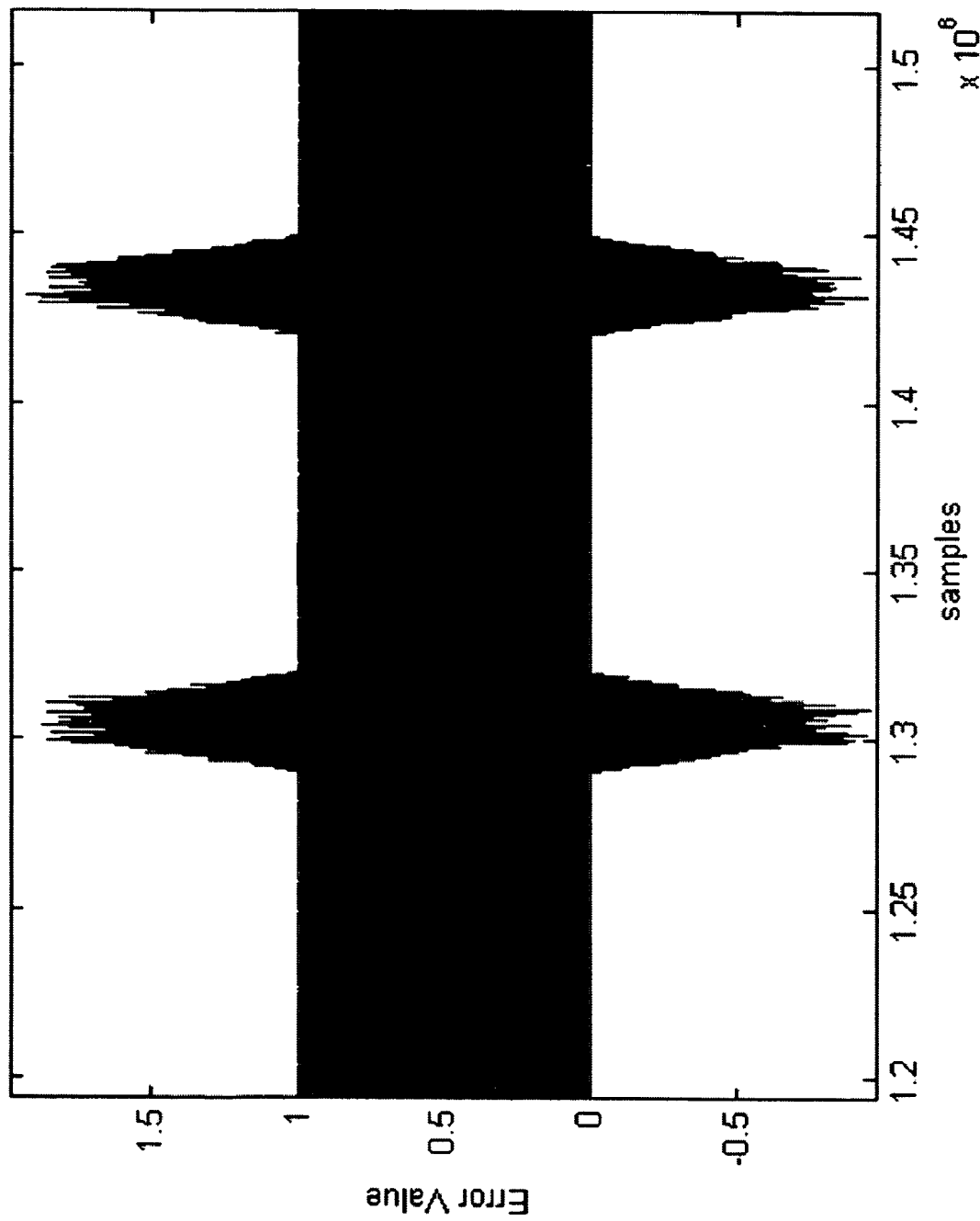
FIG. 22 is a graph showing the total error in a SSD.

Now that the program has been shown to be working correctly, the total error is analyzed. FIG. 22 illustrates how the total error increases and decreases gradually avoiding abrupt changes of noise in the total error. It is important to note that in the frames which do not need dither the noise is apparently uniform i.i.d. sequence.

Adaptive Dither in Synthetic Audio

This set of experiments use a 10% of full scale 1333 Hz cosine wave with 24 bit precision. This experiment seeks to measure the difference between the total error variance obtained with Levenberg-Marquardt algorithm (LM) and Spectral Projected Gradient (SPG) and the desired variance. The total error variance of adaptive dither techniques previously described is compared with the variance of classical dither techniques. The input signal is dithered with adaptive dither, uniform PDF dither (RPDF), triangular PDF dither (TPDF), and Gaussian PDF dither (GPDF) and re-quantized to 16 bits. The desired variance of the total error for LM and SPG has been set to 0.150 as this is below the mean variance of the total error when dither has a RPDF (i.e, near 0.17) or a TPDF (i.e, near 0.250). The length of the frames has been set between 1000 and 10000 samples.

Figure 23:
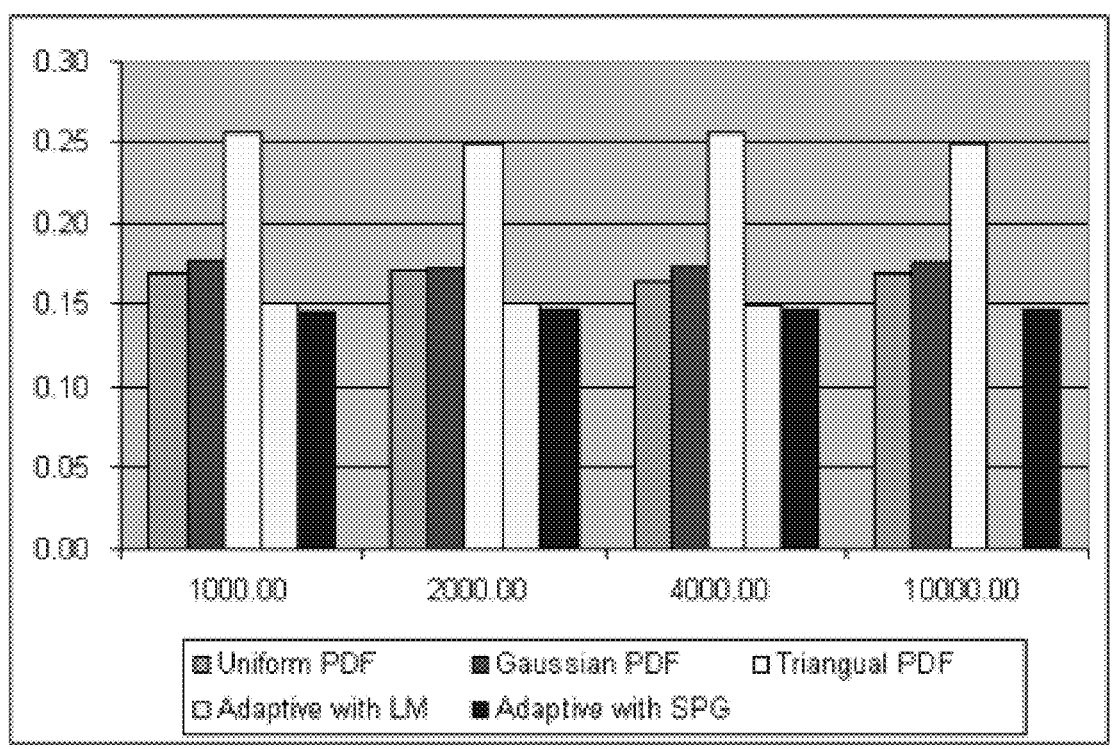
FIG. 23 shows the total error variance at 16 bits in a re-quantized signal.

FIG. 23 shows that the absolute error between the desired and the sample variance for the adaptive dither is around 0.01. In the case of Gaussian PDF and uniform PDF dithers the variance can change depending of the input signal in contrast with triangular PDF dither, which it is independent of the signal. In the case of the adaptive dithering with LM and SPG, the desired variance was approximately reached.

The previous experiment measures the variance of the total error when the re-quantized signal has 16 bits and it is necessary to measure if adaptive dither works at different bit depth in the re-quantized signal. The goal of the following experiment is to measure adaptive dither variance at different levels of quantization. The signal is quantized with adaptive dither and compared with classic techniques. The input signal has 1000 samples, the variance for adaptive dithering is set at 0.150 and the quantization levels q are 8, 13, 16 and 19.

Figure 24:
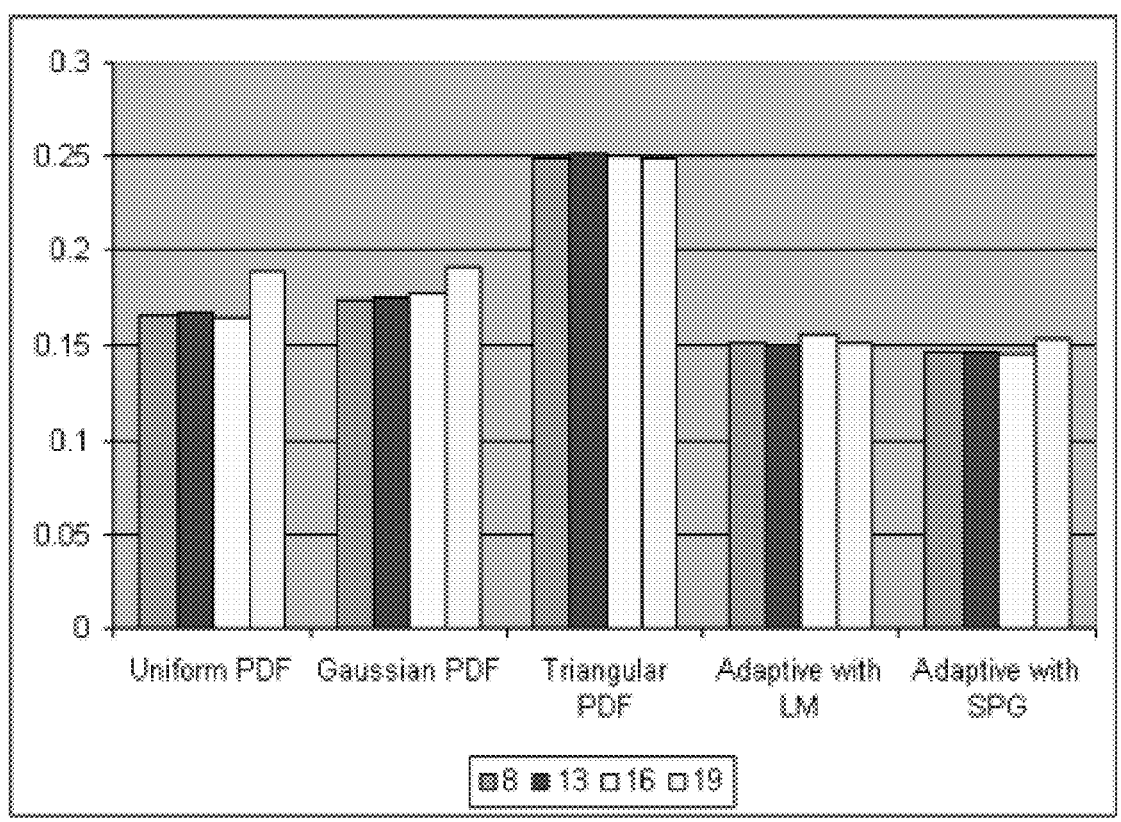
FIG. 24 shows the variances of the total error at different levels of quantization.

FIG. 24 presents the variance of the total error at different levels of quantization. The results show that the adaptive dither noise achieves the desired variance with a small error margin. Also, ANSD with LM is more accurate for this data than the adaptive dithering with SPG. Furthermore, FIG. 24 shows that for uniform PDF and Gaussian PDF the total error variance change depending of the quantization level.

The aim of the following experiment with synthetic audio is to evaluate if the desired variance of the total error is reached when this is set at different values. Specifically, this desired variance is varied between 0.11 and 0.3.

Figure 25:
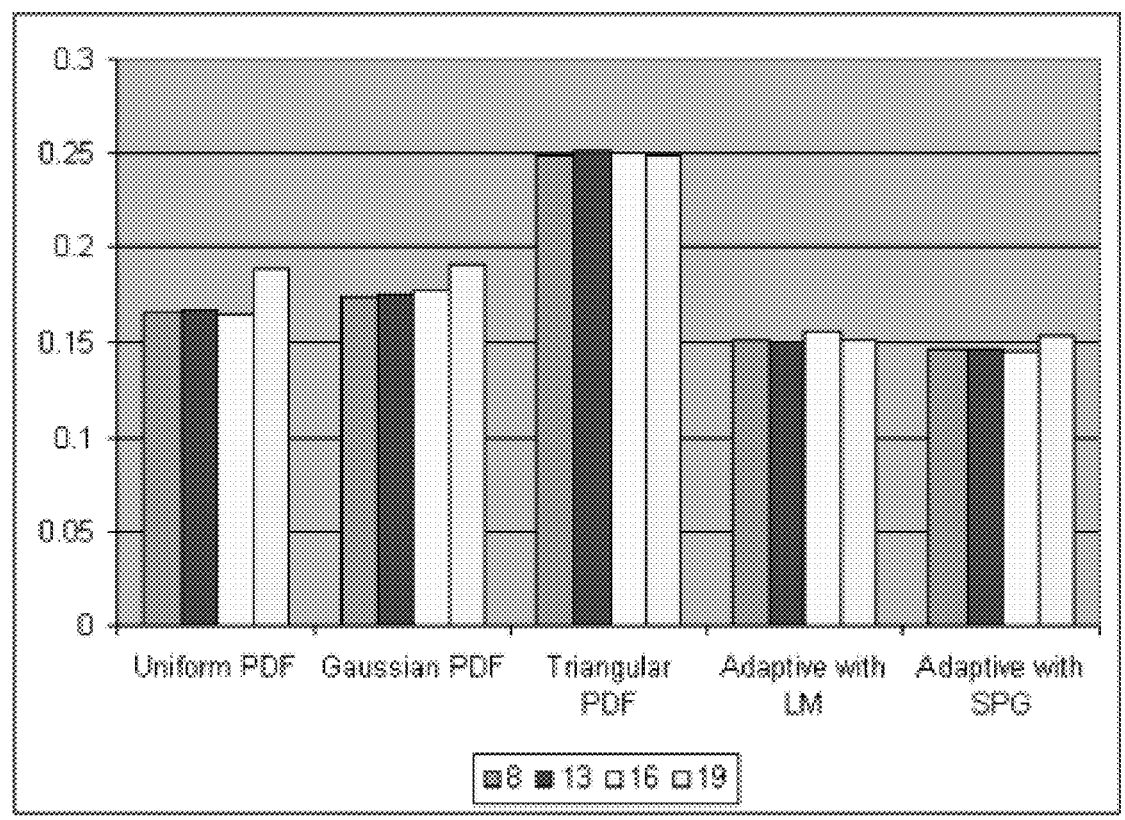
FIG. 25 shows the variances of the total error with different desired variances.

FIG. 25 shows that the sample variance of the total error is near to the desired variance. Different than the previous experiment in FIG. 24, SPG presents better results than LM.

Experiments with Adaptive Dither and Real Audio

The purpose of the following experiments is to test the adaptive dithering using real audio under various conditions. In these experiments dither is applied to each frame before to be re-quantized. This algorithm was implemented in C++ using LEVMAR (incorporated herein by reference) for LM and Ool Optimization Package (incorporated herein by reference) for SPG. The experiments used real audio with 24 bit precision and a 44.1 kHz sampling rate. The optimization packages speed is related with the number of variables, so the program segments the data into frames. Furthermore, to analyze the signal, the program needs the number of bits, the filename, the length of the frame and the number of frames to analyze.

Figure 26:
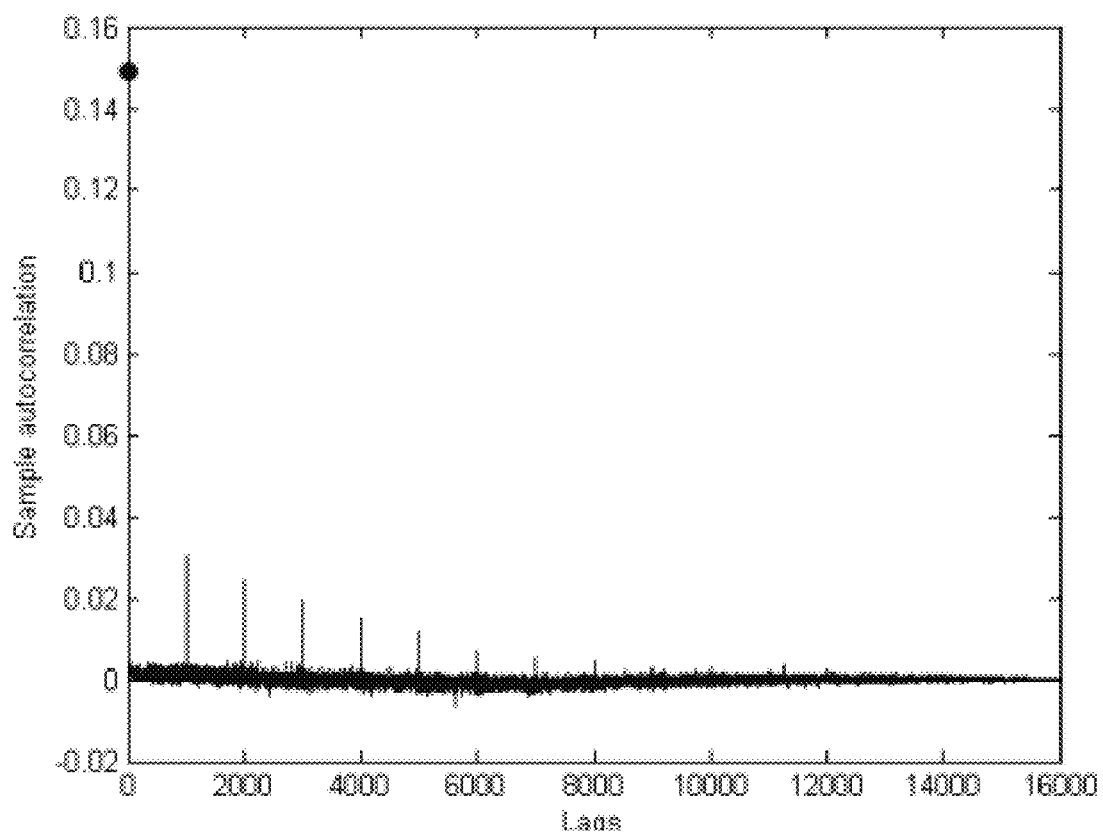
FIG. 26 shows a graph of a sample autocorrelation of ANSD with LM.

As the frames are relatively short, it was necessary to view the autocorrelation of the entire dataset to test if the total error signal was white noise. As seen in FIG. 26, in the case of ANSD with LM the total error signal has harmonics resulting in a bad quantization. The Ljung Box test was used and it rejected the null hypothesis of white noise.

Figure 27:
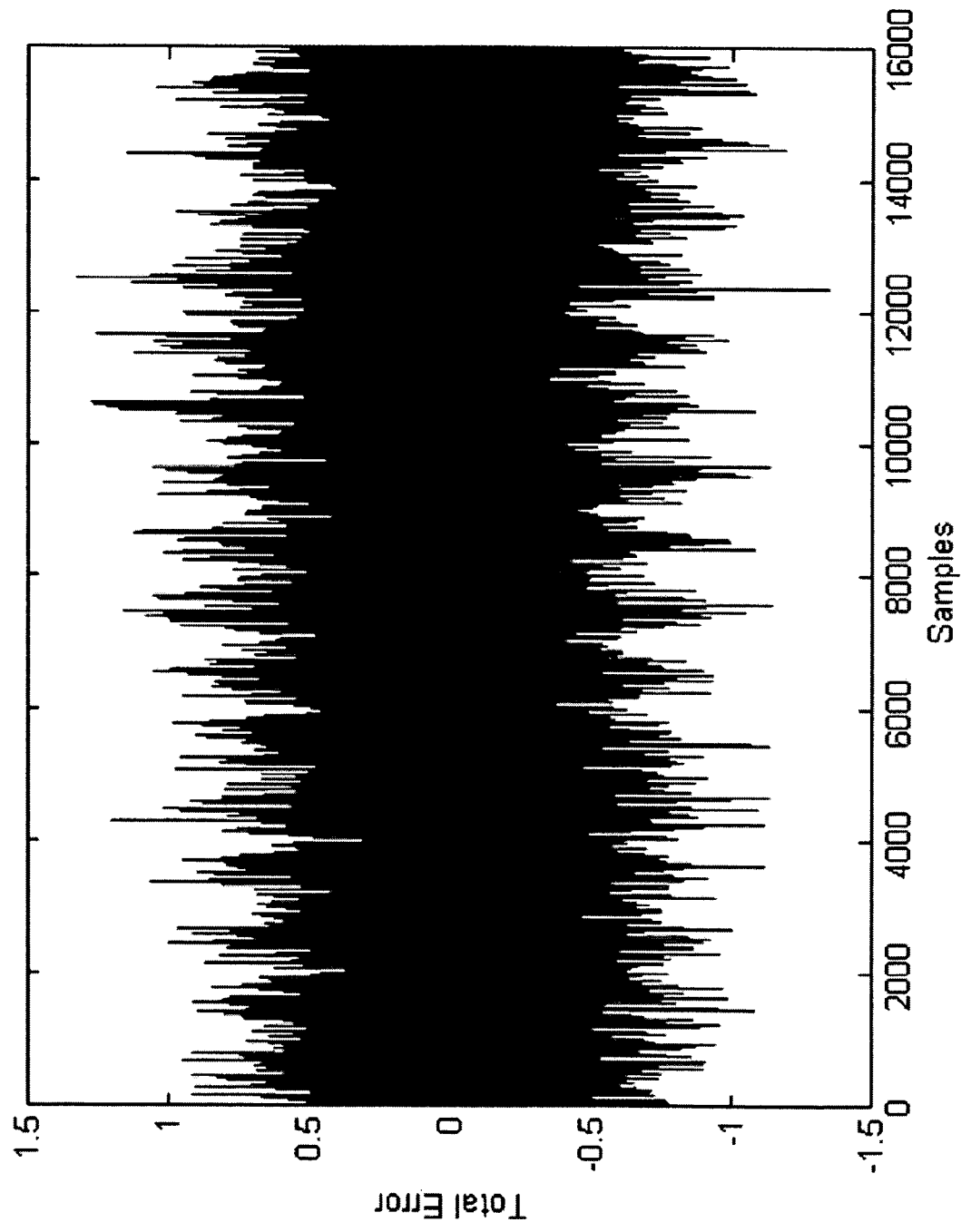
FIG. 27 shows another graph of a sample autocorrelation of ANSD with LM.

This occurs because the first and the last error signals are contributing more to the optimization than the other samples in the desired error autocorrelation equation f(d). Similarly, the second most influential samples are $\epsilon_2$ and $\epsilon_{N-1}$ and so on. This indicates that the error samples from the middle has a smaller effect than the others, showing a higher relationship between the total error frames as shown in FIG. 27. The only way found to correct this side effect was using the circular autocorrelation estimator and redefining the system of non-linear equations as can be shown in the circular autocorrelation estimator equation $f_L(d)$ and the new systems of equations for the LM algorithm f(d) respectively.

Figure 28:
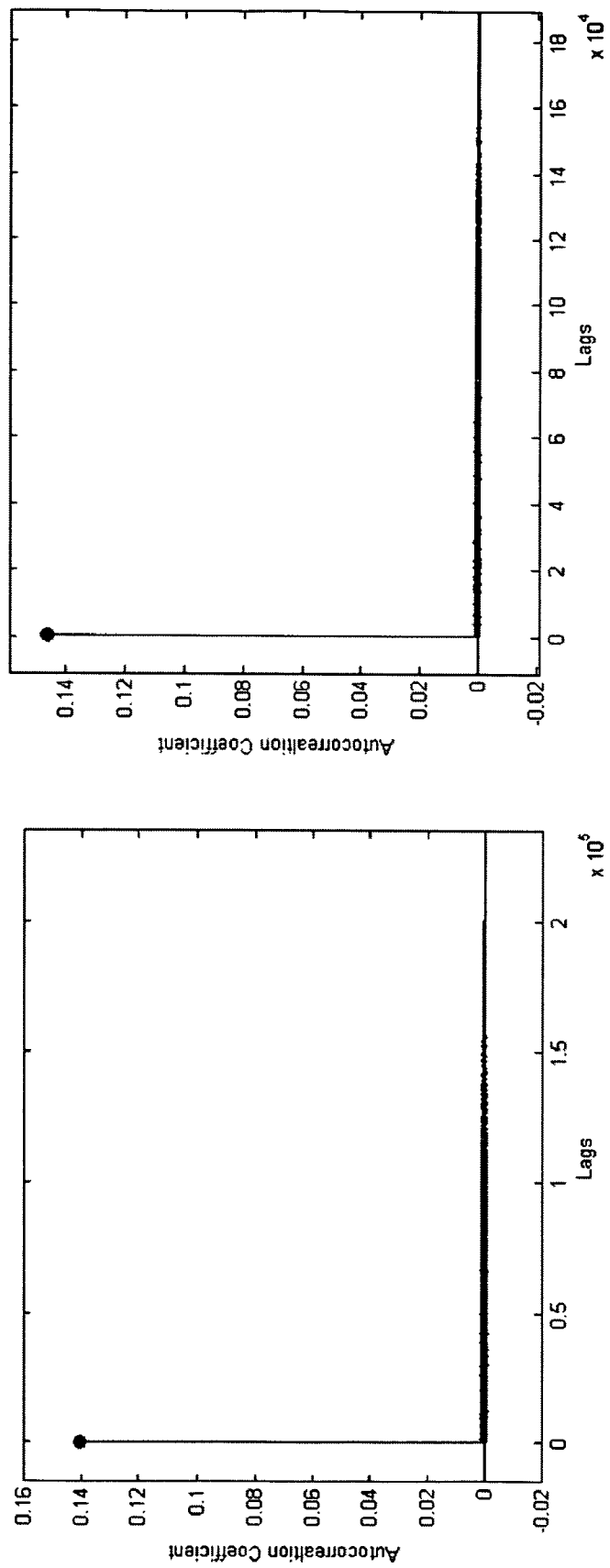
FIG. 28 shows graphs of autocorrelation of 200000 lags with frames of 1000 samples.
Figure 29:
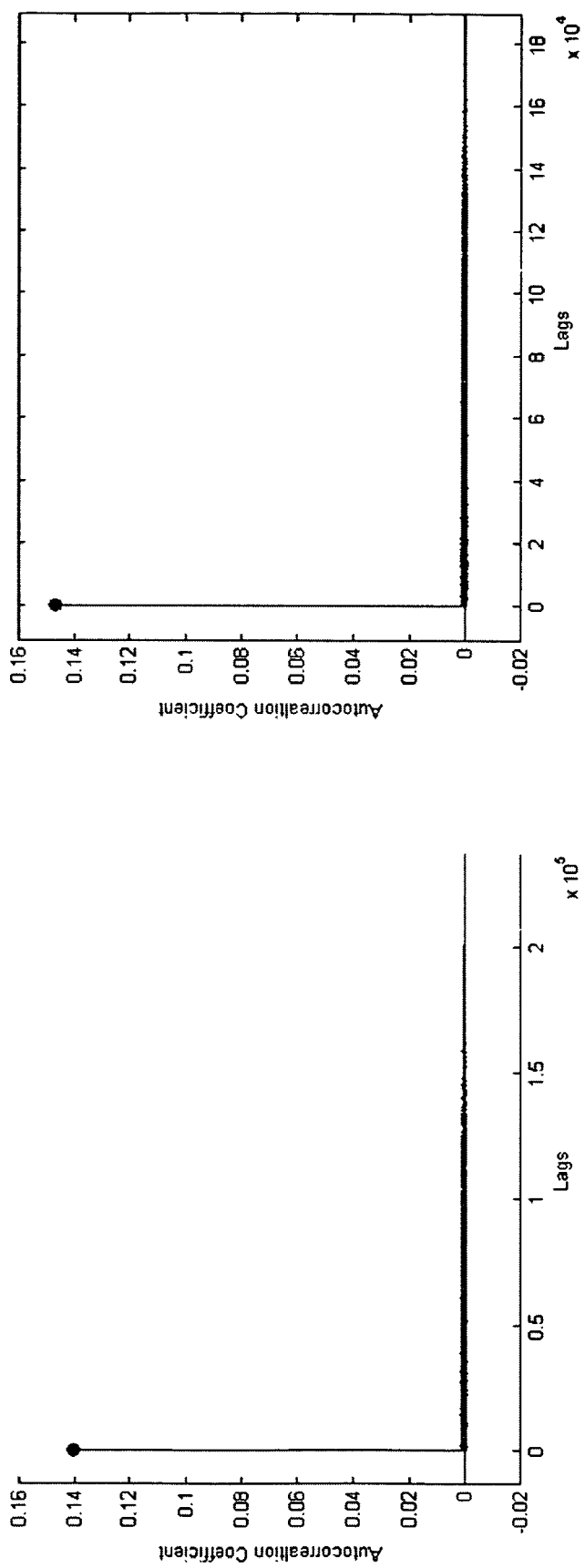
FIG. 29 shows graphs of autocorrelation of 200000 lags with frames of 2000 samples.
Figure 30:
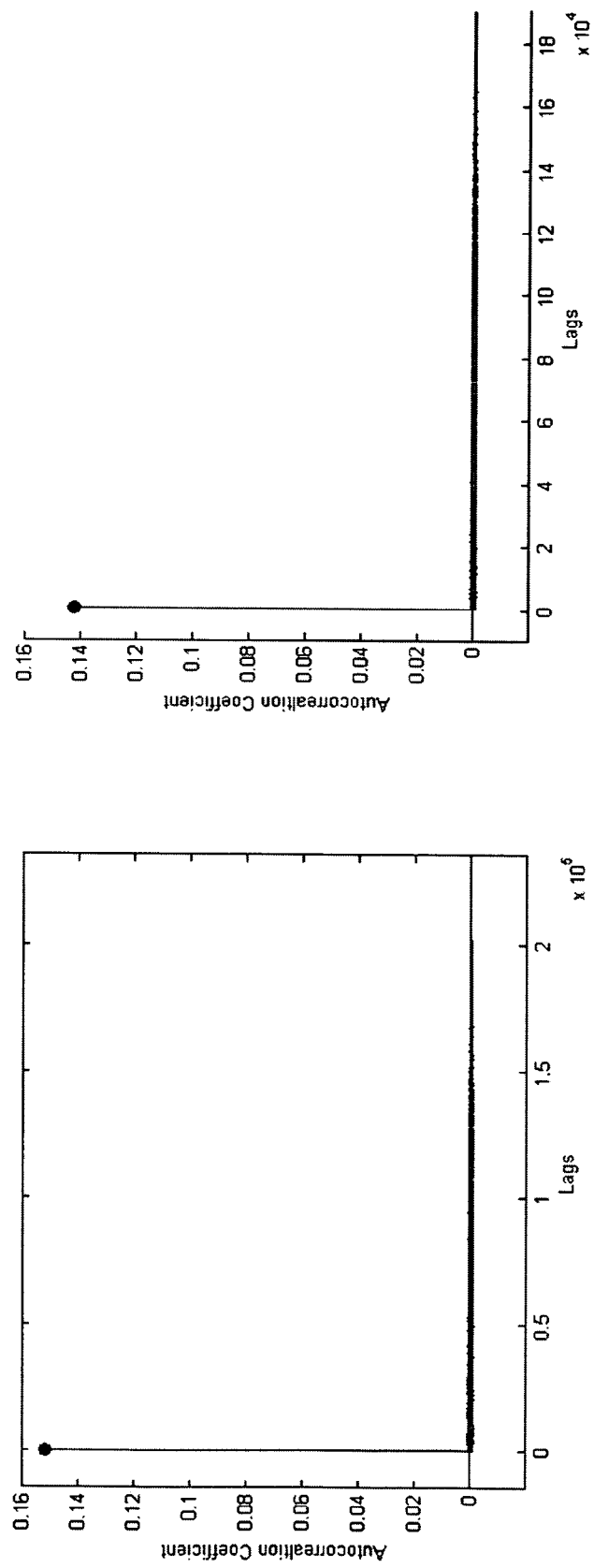
FIG. 30 shows graphs of autocorrelation of 200000 lags with frames of 4000 samples.
Figure 31:
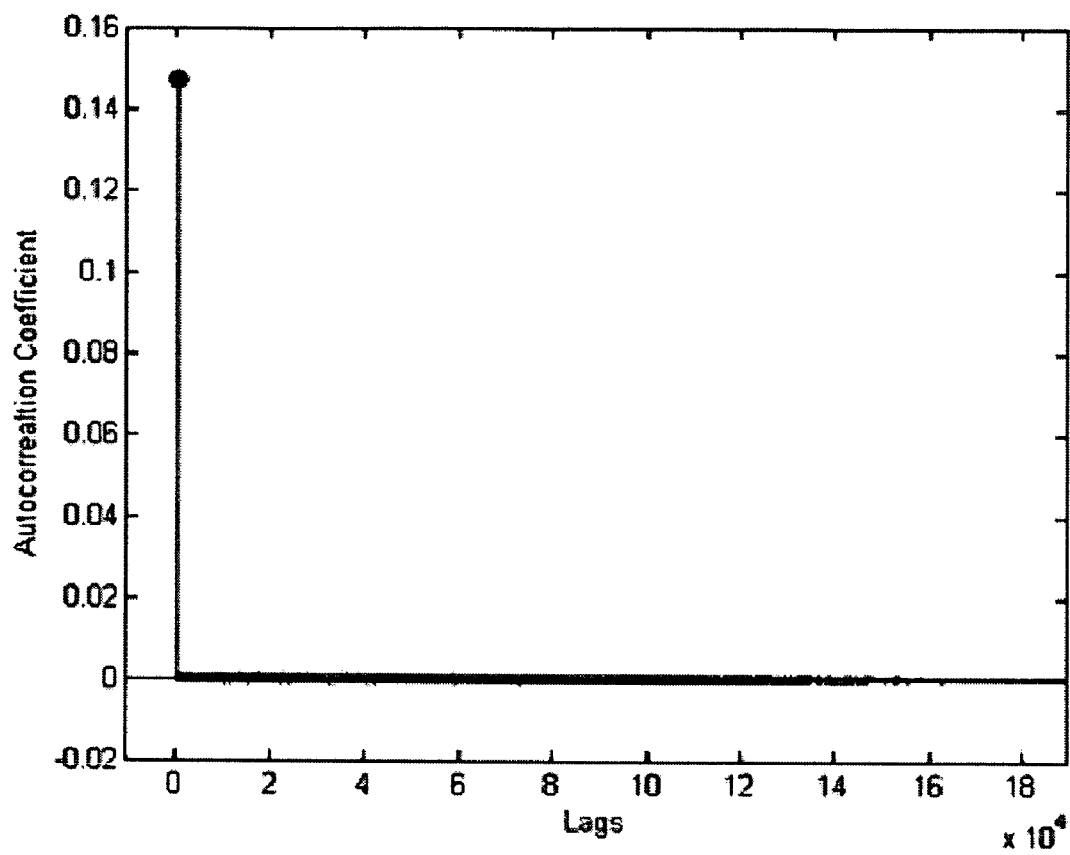
FIG. 31 shows graphs of autocorrelation of 200000 lags with frames of 1000 samples in SPG algorithm.

The following experiments with adaptive dithering and real audio are done to show that the methods reach the desired variance in the total error when the input is segmented in frames. These experiments use a set of 200000 samples segmented into frames with lengths of 1000, 2000, and 4000 samples for LM. For SPG the lengths of the frames were 1000, 2000, 4000, and 10000 samples. The desired variance in the total error is set at 0.150. The audio file has been written at 24 bits and the re-quantized signal at 16 bits. FIG. 28 shows the sample autocorrelation for ANSD with a frame length of 1000 samples. As seen in this Figure, the autocorrelation is white noise for LM and SPG. Table 2 shows that the total error in an adaptive dithering does not reject the null hypothesis of white noise for Ljung-Box Test, Box Pierce and Frequency tests.

| Dither | Ljung Box | Box Pierce | Frequency |
|---|---|---|---|
| Adaptive dither with LM | 0.9562 | 1.0000 | 0.3905 |
| Adaptive dither with SPG | 0.8287 | 1.000 | 0.3463 |

Also, FIG. 28, FIG. 29, FIG. 30 and FIG. 31 show the sample autocorrelation for frame lengths of 2000 and 4000 and 10000 samples. For these, the same behavior can be observed as in FIG. 28. In the same way, Tables 3, 4 and 5 show that the set of samples are not rejected by the hypothesis tests.

TABLE 3

| Dither | Ljung Box | Box Pierce | Frequency |
|---|---|---|---|
| Adaptive dither with LM | 0.7825 | 1.0000 | 0.3905 |
| Adaptive dither with SPG | 0.7548 | 1.000 | 0.3689 |

TABLE 4

| Dither | Ljung Box | Box Pierce | Frequency |
|---|---|---|---|
| Adaptive dither with LM | 0.9692 | 1.0000 | 0.6224 |
| Adaptive dither with SPG | 0.9985 | 1.0000 | 0.1091 |

TABLE 5

| Dither | Ljung Box | Box Pierce | Frequency |
|---|---|---|---|
| Adaptive dither with SPG | 1-000 | 0.1446 | 0.2233 |

This invention has demonstrated that hypothesis testing can be used effectively to determine if the total error of a re-quantized signal is white noise. The experiments indicate that for the 10% error level chosen, the tests are more sensitive than visual or audio inspection of the quantization error in determining if it is white noise or not. The application to real audio signal re-quantizing is straight forward. The signal can be segmented, and each segment tested for the whiteness of the quantization noise. Dither can be added to the segments that do not pass the tests. Of course, having one segment with no dither followed by another with dither may be undesirable, and also adding the typical full scale dither may not be needed. In addition to this, an application for segment dependent dithering was developed in C++ where a signal is re-quantized from 24 to 16 bits adding dither to the segments where the total quantization error is not white noise. The program has better execution time than Matlab™ and contains libraries to analyze white noise conditions in time and frequency.

A representative digital computer system can be programmed to perform the method of this invention. The system comprises of a signal receiving unit for receiving and optionally storing/buffering a digital signal; a segmenting unit for segmenting the received signal into a plurality of frames, each one comprising a selected amount of samples; a white noise detection unit receiving the plurality of frames and statistically processing each frame to determine the presence of white noise on the frames; a dithering unit receiving only the frames not having white noise for selectively adding dither to those frames; and an output unit providing a dithered signal. Alternatively, a programmable application-specific integrated circuit (ASIC) can be used to integrate at least part of the components in order to perform the method of this invention.

Other digital computer system configurations can also be employed to perform the method of this invention, and to the extent that a particular system configuration is capable of performing the method of this invention, it is equivalent to the above-explained representative digital computer system and within the scope and spirit of this invention. Once they are programmed to perform particular functions pursuant to instructions from program software that implements the method of this invention, such digital computer systems in effect become special-purpose computers particular to the method of this invention. The techniques necessary for this are well-known to those skilled in the art of computer systems.

Computer programs implementing the method of this invention will commonly be distributed to users on a distribution medium such as floppy disk or CD-ROM. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

Adaptive dithering of one dimensional signal is a new technique which has been designed solving the non-linear system of equations of the autocorrelation of the total error. The derivatives of the system are approximated using a linear function. Iterative algorithms were then used to solve the resulting non-linear system. The methods were Levenberg Marquardt and Spectral Projected Gradient. For Spectral Projected Gradient, each segment of the signal can be analyzed and the dither is obtained independently without showing a linear relationship between them. Also, the experiments show that the resulting variance in the total error using SPG reaches the desired variance with an absolute error of around 0.01. For the Levenberg Marquardt algorithm, the linear autocorrelation estimator is not useful for more than one frame. The reason for this is that the adaptive dither and the total error signals between frames are not independent causing a non-white noise signal, and consequently rejecting the null hypothesis of white noise. In order to eliminate the correlation in LM, a circular autocorrelation estimator was used giving better results than linear autocorrelation. With this estimator, the null hypothesis of the white noise test is not rejected. Moreover, different experiments changing the length of the frames and the number of bits in the re-quantized signal show that LM and SPG are accurate reaching the desired variance in the total error with a small error margin. Furthermore, the programs for SPG and LM were tested in C++ offering better performance than Matlab™. Finally, the experiments show that ANSD allows a total error signal with a constant variance from frame to frame and has a lower quantization noise variance than classic dithering techniques.

It is also envisioned that ANSD can be implemented in a parallel model which allows analyzing more data in less time. This implementation can have two schemes; the first consists of the implementation of the same program running on many platforms for different parts of the digital signal. And the second is to parallelize the optimization to improve the performance of the original program. In addition, adaptive dither and segment dependent dither can be tried for multidimensional problems.

The above description and drawings illustrate preferred embodiments which achieve the objects, features, and advantages of the present invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

We claim:

1. A computer-implemented method for determining additive dither when re-quantizing digital signals comprising:
receiving a digital signal having a bit precision M;
using a segmenting unit to segment said digital signal into a plurality of frames each having a predetermined amount of samples;
executing a white noise detection routine to determine the presence of white noise on said plurality of frames;
executing an additive dither routine to add dither to said plurality of frames based on said white noise detection routine determination; and
generating a dithered signal having a bit precision N.

2. The method of claim 1, wherein said white noise detection routine performs statistical analyses on said plurality of frames.

3. The method of claim 2, wherein the statistical analyses performed on the frames are performed in the time domain.

4. The method of claim 3, wherein at least one of: a sample correlation and a sample correlation coefficient is used to determine the presence of white noise on a frame.

5. The method of claim 4, wherein white noise is detected when either the sample correlation or the sample correlation coefficient is zero.

6. The method of claim 2, wherein the statistical analyses performed on the frames are performed in the frequency domain.

7. The method of claim 6, wherein the sample power spectral density is used to determine the presence of white noise on a frame.

8. The method of claim 7, wherein white noise is detected when the power spectral density is a constant.

9. The method of claim 1, wherein dither is selectively added only to those frames where the presence of white noise was not determined.

10. The method of claim 1, wherein said dither is added to the frames where a total quantization error is not white noise.

11. The method of claim 1, wherein said dither is an adaptive dither which depends on the signal being quantized.

12. The method of claim 1, wherein the signal-dependent dither has a total quantization error with a constant variance.

13. The method of claim 1, wherein said additive dither routine performs numerical analyses on said plurality of frames.

14. The method of claim 1, wherein said additive dither routine determines a desired dither based on the set of equations:

$$f(d) = \begin{bmatrix} f_0(d) \\ f_1(d) \\ f_2(d) \\ f_k(d) \\ f_{N-1}(d) \end{bmatrix} = \begin{bmatrix} \epsilon[0]\epsilon[0] & + & \epsilon[1]\epsilon[1] & + & \ldots & + & \epsilon[N-1]\epsilon[N-1] \\ 0 & + & \epsilon[0]\epsilon[1] & + & \ldots & + & \epsilon[N-2]\epsilon[N-1] \\ 0 & + & 0 & + & \ldots & + & \epsilon[N-3]\epsilon[N-1] \\ \vdots & & & \ddots & & & \\ 0 & + & \ldots & + & 0 & + & \epsilon[0]\epsilon[N-1] \end{bmatrix} = \begin{bmatrix} N\sigma^2 \\ 0 \\ \vdots \\ 0 \end{bmatrix},$$

where f is the autocorrelation as a function of a dither d; $\epsilon$ is the quantization error;
and N is the number of samples of the frame.

15. The method of claim 14, wherein the set of equations is iteratively solved until at least one of: the quantization error is below a threshold value and a maximum numbers of iterations is reached.

16. The method of claim 1, wherein said additive dither routine determines a desired dither based on the set of equations:

$$f(d) = k \begin{bmatrix} \epsilon_{kn}[0]\epsilon_{kn}[0] & + & \epsilon_{kn}[1]\epsilon_{kn}[1] & + & \dots & + & \epsilon_u[N-2]\epsilon_u[N-2] \\ \epsilon_u[N-1]\epsilon_{kn}[0] & + & \epsilon_{kn}[0]\epsilon_{kn}[1] & + & \dots & + & \epsilon_u[N-2]\epsilon_u[N-1] \\ \epsilon_u[N-2]\epsilon_{kn}[0] & + & \epsilon_u[N-1]\epsilon_{kn}[1] & + & \dots & + & \epsilon_u[N-3]\epsilon_u[N-1] \\ \vdots & & \ddots & & & & \\ \epsilon_u\left[\frac{N}{2}\right]\epsilon_{kn}[0] & + & \epsilon_u\left[\frac{N}{2}+1\right]\epsilon_{kn}[1] & + & \dots & + & \epsilon_{kn}\left[\frac{N}{2}\right]\epsilon_u[N-1] \end{bmatrix} = k \begin{bmatrix} N\sigma^2 \\ 0 \\ \vdots \\ 0 \end{bmatrix},$$

where f is the autocorrelation as a function of a dither d; $\epsilon_u$ is the unknown quantization error; $\epsilon_{kn}$ is the known quantization error; and N is the number of samples of the frame.

17. The method of claim 1, where M>N.

18. A computer-readable medium storing a computer program implementing the method of claim 1.

19. A digital computer system programmed to perform the method of claim 1.

* * * * *